US012575062B2

(12) United States Patent
Oseen-Senda et al.

(10) Patent No.: US 12,575,062 B2
(45) Date of Patent: Mar. 10, 2026

(54) VAPOR RECOVERY SYSTEM FOR IMMERSION COOLED DATA CENTERS

(71) Applicant: Microsoft Technology Licensing, LLC, Redmond, WA (US)

(72) Inventors: Kathryn M. Oseen-Senda, Seattle, WA (US); Martha Geoghegan Peterson, Woodinville, WA (US); Dennis Trieu, Calgary (CA); Alexis Grace Schubert, Seattle, WA (US); Eric C. Peterson, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 490 days.

(21) Appl. No.: 18/083,232

(22) Filed: Dec. 16, 2022

(65) Prior Publication Data

US 2024/0198252 A1     Jun. 20, 2024

(51) Int. Cl.
*H05K 7/20*          (2006.01)
*B01D 5/00*          (2006.01)
        (Continued)

(52) U.S. Cl.
CPC ........... *H05K 7/203* (2013.01); *B01D 5/0003* (2013.01); *B01D 5/0051* (2013.01);
        (Continued)

(58) Field of Classification Search
None
See application file for complete search history.

(56) References Cited

U.S. PATENT DOCUMENTS

| | | | | |
|---|---|---|---|---|
| 4,683,125 A | * | 7/1987 | Yusa ...................... | B01D 53/02 |
| | | | | 423/220 |
| 7,658,789 B1 | | 2/2010 | Krumbholz | |

(Continued)

FOREIGN PATENT DOCUMENTS

| | | | | | |
|---|---|---|---|---|---|
| JP | S6039853 A | * | 3/1985 | ............. | F25D 31/00 |
| KR | 20200078876 A | * | 7/2020 | ........... | B01D 53/002 |

(Continued)

OTHER PUBLICATIONS

KR20200078876A_ENG (Espacenet machine translation of Kim) (Year: 2020).*

(Continued)

*Primary Examiner* — Gabriel E Gitman
(74) *Attorney, Agent, or Firm* — Ray Quinney & Nebeker P.C.; Paul N. Taylor

(57)          ABSTRACT

A vapor recovery system comprises an inlet located at a first end of a fluid path configured to receive a fluid vapor to the vapor recovery system. The vapor recovery system comprises a condenser located on the fluid path and a scrubber located on the fluid path. The vapor recovery system comprises a composition sensor located on the fluid path between the scrubber and a second end of the fluid path. The composition sensor is configured to measure a composition of the fluid vapor. The vapor recovery system comprises an exhaust located at the second end of the fluid path configured to exhaust at least a portion of the fluid vapor from the fluid path at a composition having an amount of a working fluid below a working fluid threshold.

20 Claims, 9 Drawing Sheets

(51) Int. Cl.
  *B01D 53/00*     (2006.01)
  *B01D 53/04*     (2006.01)
  *B01D 53/26*     (2006.01)

(52) U.S. Cl.
  CPC ......... *B01D 5/0057* (2013.01); *B01D 53/002*
    (2013.01); *B01D 53/0438* (2013.01); *B01D*
    *53/0446* (2013.01); *B01D 53/0454* (2013.01);
    *B01D 53/261* (2013.01); *H05K 7/20318*
    (2013.01); *H05K 7/20327* (2013.01); *H05K*
    *7/20818* (2013.01); *B01D 53/0462* (2013.01);
    *B01D 2257/80* (2013.01); *B01D 2259/4009*
    (2013.01); *B01D 2259/40092* (2013.01)

(56)                References Cited

U.S. PATENT DOCUMENTS

| | | | |
|---|---|---|---|
| 2020/0170305 A1* | 6/2020 | Tan | B65B 7/285 |
| 2021/0185859 A1* | 6/2021 | Gao | G06F 1/20 |
| 2021/0307210 A1* | 9/2021 | Wong | H05K 7/20327 |
| 2022/0087048 A1* | 3/2022 | Enright | H05K 7/20818 |
| 2022/0152520 A1 | 5/2022 | Schubring et al. | |
| 2023/0080447 A1* | 3/2023 | Shah | H05K 7/20836 |
| | | | 361/679.53 |

FOREIGN PATENT DOCUMENTS

| | | | |
|---|---|---|---|
| WO | 2014088630 A1 | 6/2014 | |
| WO | 2017055466 A1 | 4/2017 | |

OTHER PUBLICATIONS

JPS6039853A_ENG (Espacenet machine translation of Goino) (Year: 1985).*
International Search Report and Written Opinion received for PCT Application No. PCT/US23/035664, Apr. 8, 2024, 21 pages.
Invitation to Pay Additional Fees received for PCT Application No. PCT/US23/035664, mailed on Feb. 16, 2024, 14 pages.

* cited by examiner

Adsorbent Isotherm

440

| Receive fluid vapor | ~ 441 |

| Condense working fluid | ~ 442 |

| Adsorb working fluid | ~ 443 |

| Determine composition | ~ 444 |

| Exhaust fluid vapor | ~ 445 |

550

Receive fluid vapor      ~ 551

Condense working fluid      ~ 552

Exhaust fluid vapor      ~ 553

Maintain pressure differential      ~ 554

VAPOR RECOVERY SYSTEM FOR IMMERSION COOLED DATA CENTERS

CROSS-REFERENCE TO RELATED APPLICATIONS

N/A

BACKGROUND

Computer cooling is the process of removing waste heat generated by system components within a computer system to keep components within permissible operating temperature limits. Cooling is important because computer components are susceptible to temporary malfunction or permanent failure if they are overheated.

A data center is a physical facility that is used to house computer systems and associated components. A data center typically includes a large number of computing devices (e.g., servers), which may be stacked in racks that are placed in rows. In some data centers, equipment, space, and network bandwidth are available for rental to customers.

A data center typically includes a cooling system to enable the computing devices within the data center to continue working within their specified thermal limits. Many computing devices use air for cooling system components requiring data centers to utilize air-based cooling techniques to transfer the heat to the external environment. Air has a low specific heat capacity requiring large amounts of air to remove a watt of heat. Air-based cooling techniques often require expensive infrastructure components such as computer room air conditioning (CRAC) units, air handling units, air conditioner compressors, air circulation fans, duct work, air handlers, dehumidifiers, and the like.

One of the challenges in managing a data center is achieving the right balance between space and power. For various reasons, power density has increased considerably over the last few years. As server racks become more thermally dense requiring greater quantities of air for cooling, however, the costs and logistics of conventional cooling using air becomes increasingly challenging.

Some data centers utilize immersion cooling techniques in which computing devices are submerged in a thermally conductive, electrically isolating dielectric fluid, which may be referred to as a working fluid or a heat transfer fluid. In an immersion cooling system, at least one container (e.g., a tank) is filled with the working fluid, and computing devices are placed in the container. The container may be referred to herein as an immersion tank. The working fluid has a higher heat capacity than air requiring less fluid volume for a given heat load. This is because convective heat transfer through air is less efficient than heat transfer through boiling of a working fluid. In immersion cooling, heat is removed from the computing devices by circulating the working fluid into direct contact with hot components, then through heat exchangers where the waste heat is transferred to ultimately be rejected to the external environment. Fluids suitable for immersion cooling have very good insulating properties to ensure that they can safely come into contact with energized electronic components without significantly altering the electrical characteristics of the system or system components. Immersion cooling has the potential to become a popular cooling solution for data centers because it allows operators to drastically reduce their energy usage through the elimination of the air-cooling infrastructure.

Broadly speaking, there are two different types of immersion cooling techniques: single-phase immersion cooling and two-phase immersion cooling.

With a single-phase immersion cooling system, the working fluid never changes state and always remains in a liquid form. In some implementations, the working fluid may be actively circulated by pumping the dielectric coolant in, through, and around the computing devices being cooled, and then transferring the heat absorbed by the coolant to a heat rejection device such as a radiator, dry cooler, liquid-to-liquid heat exchanger, or cooling tower. Alternatively, the working fluid may be passively circulated by the natural convection of the heated coolant to the heat rejection device(s).

In a two-phase immersion cooling system, the heat of vaporization and the specific heat capacity characteristics of the work fluid are utilized for cooling. The working fluid generally has a relatively low boiling point such that heat absorbed by the fluid surrounding the computing devices causes a portion of the working fluid (e.g., liquid state working fluid) to boil off or vaporize into a gas, thereby enabling the phase change of the working fluid to carry heat away from the computing devices. The vapors produced by the boiling of the working fluid rise above the fluid pool where they contact a condenser that is cooler than the working fluid's boiling point. This causes the vapors to condense back into a liquid and, for example, fall back into the fluid pool.

To maintain a suitable condenser temperature, cool liquid may be pumped through the condenser. Thus, a two-phase immersion cooling system may also include one or more condenser pumps that are configured to pump cool liquid through the condenser(s) in the system.

An immersion tank that is used in connection with a two-phase immersion cooling system generally includes some type of mechanism that allows the immersion tank to be sealed in order to prevent vapors produced by the boiling of the working fluid from escaping out of the immersion tank. For example, an immersion tank may include a door that can be opened and closed, and the door may generally be kept closed during normal operation of the immersion cooling system. From time to time, however, it may be necessary to open the door to gain access to the computing devices within the immersion tank. For example, it may be necessary to remove one or more computing devices from the immersion tank in order to perform maintenance, possibly as part of planned maintenance and/or to replace components that have failed.

When an immersion tank is opened to permit access to the computing devices contained therein, some loss of vaporized working fluid may occur. Some of this loss may be caused by air currents that push the vaporized working fluid outside of the immersion tank. These air currents may be produced in many different ways. As an example, air currents may be produced by the opening of the door to the immersion tank. As another example, air currents may be produced by a climate control system in the room in which the cooling system is located. Some of the loss may be due to a positive pressure within the immersion tank, or a pressure within the immersion tank being greater than the atmospheric pressure exterior to the immersion tank. For example, a positive pressure within the immersion tank may cause vaporized working fluid to escape upon opening of the immersion tank door.

The working fluids used in immersion cooling systems are typically quite expensive. Additionally, exposure to vaporized working fluid can be hazardous to health (e.g., the working fluid may be toxic to inhale, or may present a risk of asphyxiation if allowed to collect in an enclosed space). The loss of vaporized working fluid is therefore undesirable, and a reduction in the amount of lost vaporized working fluid can provide significant cost savings, and increased safety. Accordingly, benefits may be realized by a vapor recovery system for immersion cooled data centers.

SUMMARY

In some embodiments, a vapor recovery system comprises an inlet located at a first end of a fluid path configured to receive a fluid vapor to the vapor recovery system. The vapor recovery system further comprises a condenser located on the fluid path and a scrubber located on the fluid path. The vapor recovery system further comprises a composition sensor located on the fluid path between the scrubber and a second end of the fluid path. The composition sensor is configured to measure a composition of the fluid vapor (e.g., an exhaust gas). The vapor recovery system further comprises an exhaust located at the second end of the fluid path configured to exhaust at least a portion of a fluid vapor from the fluid path at a composition having an amount of a working fluid below a working fluid threshold.

In some embodiments, a method of operating a vapor recovery system comprises receiving a fluid vapor, condensing a first portion of a working fluid from the fluid vapor, and adsorbing a second portion of the working fluid from the fluid vapor. The method further comprises determining a composition of a processed fluid vapor after condensing the first portion of the working fluid and after adsorbing the second portion of the working fluid. The method further includes exhausting the fluid vapor if the composition is determined to be below a working fluid threshold.

In some embodiments, a method of operating a vapor recovery system comprises receiving a fluid vapor at a first end of a fluid path, condensing a working fluid from the fluid vapor with a condenser located on the fluid path, and exhausting at least a portion of the fluid vapor at a second end of the fluid path. The method further comprises maintaining a negative pressure differential between the first end of the fluid path and the second end of the fluid path.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows. Features and advantages of the disclosure may be realized and obtained by means of the systems and methods that are particularly pointed out in the appended claims. Features of the present disclosure will become more fully apparent from the following description and appended claims, or may be learned by the practice of the disclosed subject matter as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. Understanding that the drawings depict some example embodiments, the embodiments will be described and explained with additional specificity and detail through the use of the accompanying drawings in which:

FIG. 2-1 is a process diagram of a vapor recovery system, according to at least one embodiment of the present disclosure;

FIG. 2-2 is a process diagram of the vapor recovery system of FIG. 2-1;

FIG. 2-3 is a process diagram of the vapor recovery system of FIG. 2-1;

FIG. 2-4 is a process diagram of the vapor recovery system of FIG. 2-1;

FIG. 3 is a graph illustrating an adsorbent curve for an example adsorbent, according to at least one embodiment of the present disclosure;

FIG. 4 is a flow diagram of a method of using a vapor recovery system, according to at least one embodiment of the present disclosure;

DETAILED DESCRIPTION

Figure 1:
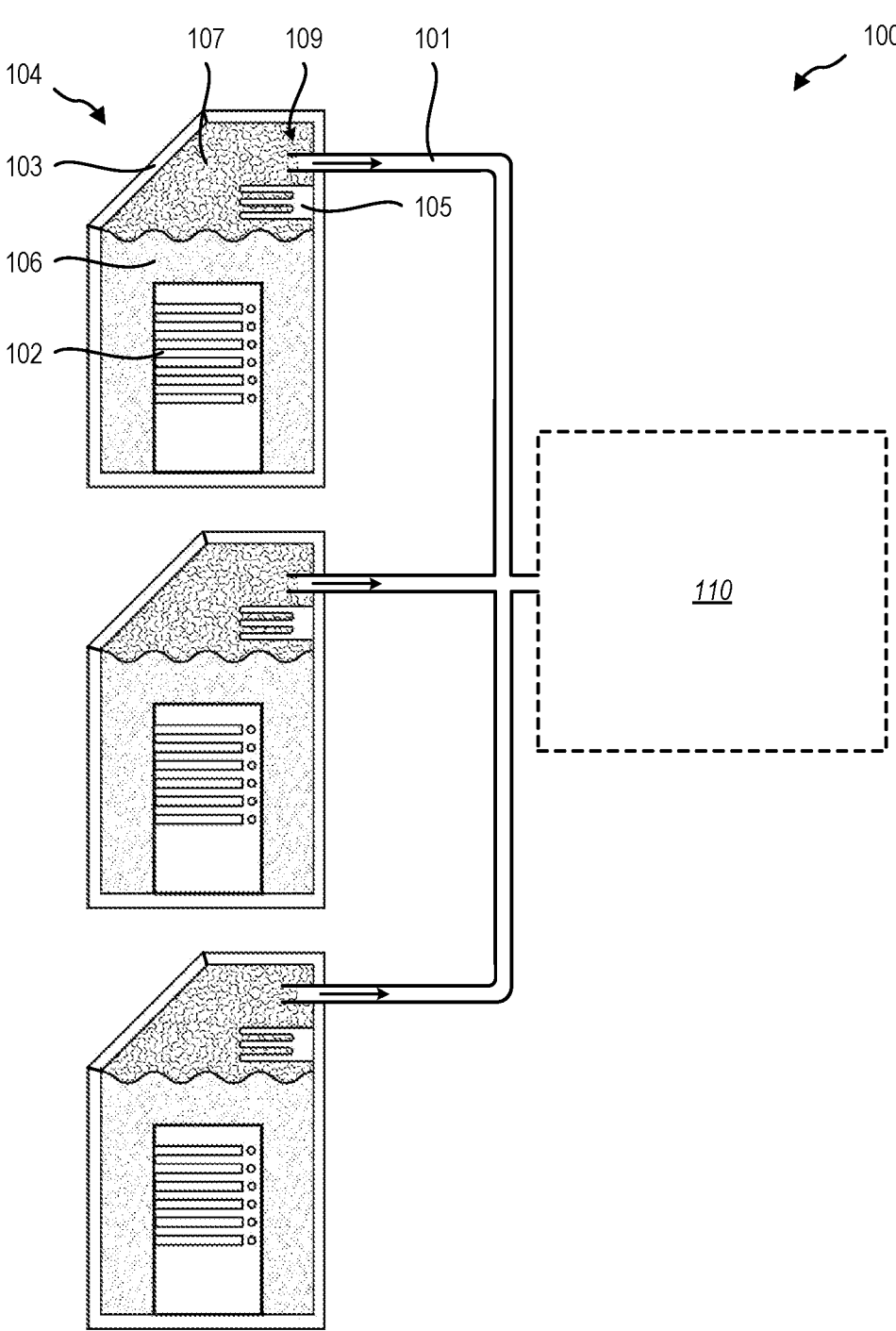
FIG. 1 is a diagram of a data center employing a vapor recovery system, according to at least one embodiment of the present disclosure.

The present disclosure is generally related to systems and methods for vapor recovery in immersion cooled data centers.

Two-phase immersion cooling systems typically employ a pool of working fluid that is dielectric, or not electrically conductive. One or more computing devices is submerged in the pool and heat is transferred to the working fluid causing a portion of the working fluid to boil. Typically, a condenser is positioned near an upper surface of the working fluid pool and used to cool and condense vaporized working fluid into liquid form and back into the pool. However, the condenser typically does not condense all of the vapor present in the tank at any given time. For example, the condenser may maintain the space inside the immersion tank at an equilibrium concentration. Vaporized working fluid may therefore escape out of the immersion tank, for example, when a door of the immersion tank is opened to access the computing devices contained within the immersion tank.

In accordance with at least one embodiment of the present disclosure, a data center may employ a vapor recovery system for preventing expensive and/or dangerous working fluid vapors from escaping an immersion tank operating in a two-phase immersion cooling system. The vapor recovery system may also collect or recover some or all of the working fluid from the fluid vapor it receives. For example, the immersion tank may be connected to the vapor recovery system, and the vapor recovery system may remove fluid vapors including vaporized working fluid from the immersion tank before and/or while the immersion tank door is opened.

In some embodiments, an inlet of the vapor recovery system may be connected to the immersion tank. The inlet may be maintained at a negative pressure such that fluid vapor may flow from the immersion tank and into the inlet. For example, the inlet may maintain the immersion tank at a slightly negative pressure, and when the immersion tank door is opened, outside air may rush into the immersion tank and/or the inlet instead of the fluid vapor rushing out. In this way, fluid vapor may be removed from the immersion tank to the vapor recovery system without fluid vapor escaping out of the immersion tank door.

In some embodiments, the vapor recovery system may include a condenser. The fluid vapor may pass through the condenser, and at least a portion of the working fluid in the fluid vapor may be condensed back into a liquid. The working fluid may be collected from the condenser and returned to the immersion tank or stored in a temporary storage tank. In some embodiments, the vapor recovery system may include a scrubber. The fluid vapor may pass through the scrubber, and at least a portion of the working fluid remaining in the fluid vapor may be adsorbed by the scrubber. In this way, the condenser and/or scrubber may remove at least a portion of the working fluid from the fluid vapor flowing through the vapor recovery system.

In some embodiments, the vapor recovery system may include a composition sensor. A composition of the fluid vapor may be determined after passing through the condenser and/or the scrubber. If the amount of working fluid in the fluid vapor is below a threshold value, the vapor recovery system may exhaust the fluid vapor out of the system. If the working fluid is not below the threshold, the vapor recovery system may return the fluid vapor back through various components and/or processes of the vapor recovery system to remove more of the working fluid.

In some embodiments, the working fluid may react negatively with water. Additionally, water is electrically conductive and as such it may be undesirable that water be present in the working fluid and/or exposed to the computing devices. Further, one or more components of the vapor recovery system may be susceptible to corrosion if exposed to water (such as a heat exchanger, condenser, etc.) In some embodiments the vapor recovery system may include one or more desiccants. The fluid vapor may pass through one or more desiccants at various stages in the vapor recovery system to remove water vapor from the fluid vapor, or to prevent water vapor from entering the vapor recovery system.

In some embodiments, the vapor recovery system may include a pump or a fan. The pump may be positioned at the exhaust of the vapor recovery system and may maintain the exhaust at a negative pressure relative to the inlet. In other words, the pump may provide a suction and fluid vapor may be pulled through the vapor recovery system by the pump. The pump may also maintain the vapor recovery system and/or the immersion tank at less than atmospheric pressure to ensure that no fluid vapor or working fluid may escape the system.

In some embodiments, the vapor recovery system may include a gas expansion system. The gas expansion system may regulate a constant flow rate through at least a portion of the vapor recovery system. For example, a valve between the immersion tank and the inlet may be periodically opened and a volume of fluid vapor may be periodically released from the immersion tank to the vapor recovery system. The volume of fluid vapor may flow into the gas expansion system where it may be slowly released to flow through a downstream portion of the vapor recovery system. In this way the vapor recovery system may accommodate for a surge of fluid vapor introduced into the system while still operating at a constant flow rate.

In some embodiments, the vapor recovery system may include a chiller. The chiller may be connected to the condenser and/or the scrubber to provide cooling. This may facilitate the removal of the working fluid from the fluid vapor by the condenser and/or the scrubber. In some embodiments, waste heat from the chiller may be used to warm up the fluid vapor leaving the condenser and/or the scrubber with a heat sink. In some embodiments, the scrubber may include an active scrubber and an inactive scrubber. The inactive scrubber may be substantially full of adsorbed working fluid. Waste heat from the chiller may be used to facilitate desorption of the inactive scrubber and/or evaporation of working fluid from the inactive scrubber into the fluid vapor and back into various stages of the vapor recovery system.

As will be discussed herein in detail, the vapor recovery system may be employed in connection with a two-phase immersion cooling system. Expensive and/or dangerous working fluids may be collected by the vapor recovery system for further use while maintaining exposure to working fluid vapors below an acceptable level.

FIG. 1 is a diagram of a data center 100 employing a vapor recovery system 110, according to at least one embodiment of the present disclosure. In some embodiments, the data center 100 may house one or more computing devices 102 and one or more immersion tanks 104. Each of the immersion tanks 104 may hold one or more of the computing devices 102. The immersion tanks 104 may be at least partially filled with a pool of a working fluid 106 such that the one or more computing devices 102 are at least partially submerged in the working fluid 106.

As discussed herein, the working fluid 106 may be a dielectric fluid, or a non-electrically conductive fluid. In some embodiments, the working fluid 106 may have a relatively low boiling point. For example, the working fluid 106 may have a boiling point that is below 50° C. In this way, the computing device 102 may be submerged in the pool of working fluid 106, and the heat of vaporization of the working fluid 106 may be effectively utilized through boiling to remove heat from the computing device 102.

As discussed herein, a portion of the working fluid 106 may boil off into a gas, thereby producing vaporized working fluid 107. The vaporized working fluid 107 may rise to the top of the pool and collect in an upper portion of the immersion tank 104 (e.g., an overhead gas space of the immersion tank). In some embodiments, the immersion tank 104 may include an immersion tank condenser 105. As discussed herein, the immersion tank condenser 105 may include one or more cooled coils which may facilitate condensation of the vaporized working fluid 107 back into the pool of working fluid 106. In this way, the working fluid 106 may be cycled between liquid and gas phases to provide cooling of the computing device 102.

In some embodiments, the vaporized working fluid 107 may form part or all of a fluid vapor 109. In some embodiments, the fluid vapor 109 may be composed entirely of the vaporized working fluid 107. In some embodiments, the fluid vapor 109 may include other fluids that may be present in the immersion tank 104 such as ambient air and/or water vapor. The fluid vapor 109 may collect in an upper portion of the immersion tank 104 above the pool of working fluid 106. In some embodiments, the immersion tank may include a door 103. The door 103 may be closed and sealed to prevent the fluid vapor 109 from escaping the immersion tank 104. From time to time, however, the door 103 may be opened in order to gain access to the computing devices 102 within the immersion tank 104. This may allow the fluid vapor 109, including the vaporized working fluid 107, to escape the immersion tank 104. For example, the boiling of the working fluid 106 may cause a positive pressure in the immersion tank 104 relative to the atmosphere, and the fluid vapor 109 may rush out of the immersion tank when the door 103 is opened. In another example, opening of the door 103 may cause air currents to flow out of the immersion tank 104, which may in turn cause the fluid vapor 109 to flow out of the immersion tank 104. As discussed herein, loss of the vaporized working fluid 107 from the immersion tank may be undesirable, as the working fluid 106 may typically be expensive and/or hazardous to health.

According to at least one embodiment of the present disclosure, the data center 100 may include a vapor recovery system 110. As will be discussed herein in detail, the vapor recovery system 110 may remove the fluid vapor 109 from the immersion tank 104. For example, the vapor recovery system 110 may be connected to one or more immersion tanks 104 through one or more manifolds 101. The manifolds 101 may be connected to an inlet of the vapor recovery system 110. In this way, the immersion tanks 104 and the vapor recovery system 110 may be in fluid communication. The vapor recovery system 110 may provide a negative pressure, or a suction, to the immersion tanks 104 through the manifolds 101. For example, the vapor recovery system 110 may suck or remove at least some of the fluid vapor 109 from the immersion tank 104 prior to the door 103 being opened. This may create a negative pressure within the immersion tank 104 relative to the atmosphere. When the door 103 is opened, ambient air may rush into the immersion tank 104 and the fluid vapor 109 may flow into the manifold 101 instead of out of the door 103. In some embodiments, the negative pressure in the immersion tanks is a slight negative pressure. For example, the negative pressure may be in an amount such as to prevent the fluid vapor 109 from escaping, but not so much so that the door 103 becomes vapor locked and is incapable of being opened. As will be discussed herein, the vapor recovery system 110 may process the fluid vapor 109 received from the immersion tanks 104 in order to collect the working fluid 106 from the fluid vapor 109. In this way, the vapor recovery system 110 may prevent loss of and exposure to the working fluid 106 through the door 103 of the immersion tank 104, while recovering the working fluid 106 for further use.

Figures 1, 2:
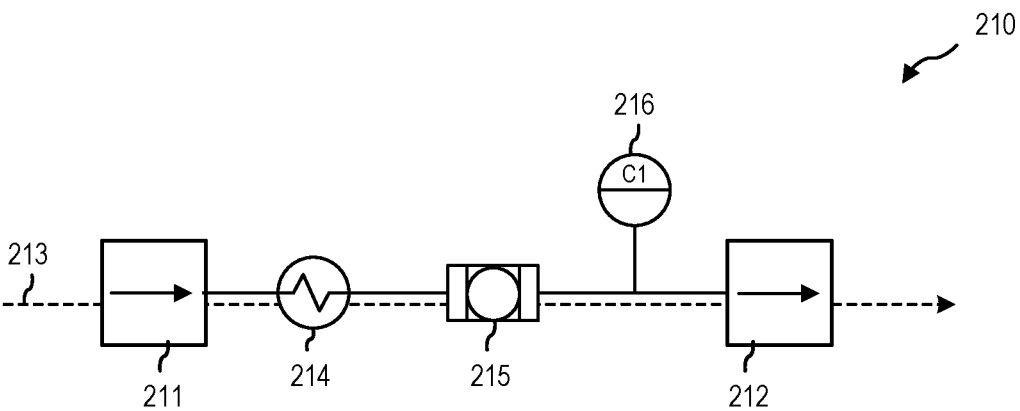
Figure 2:
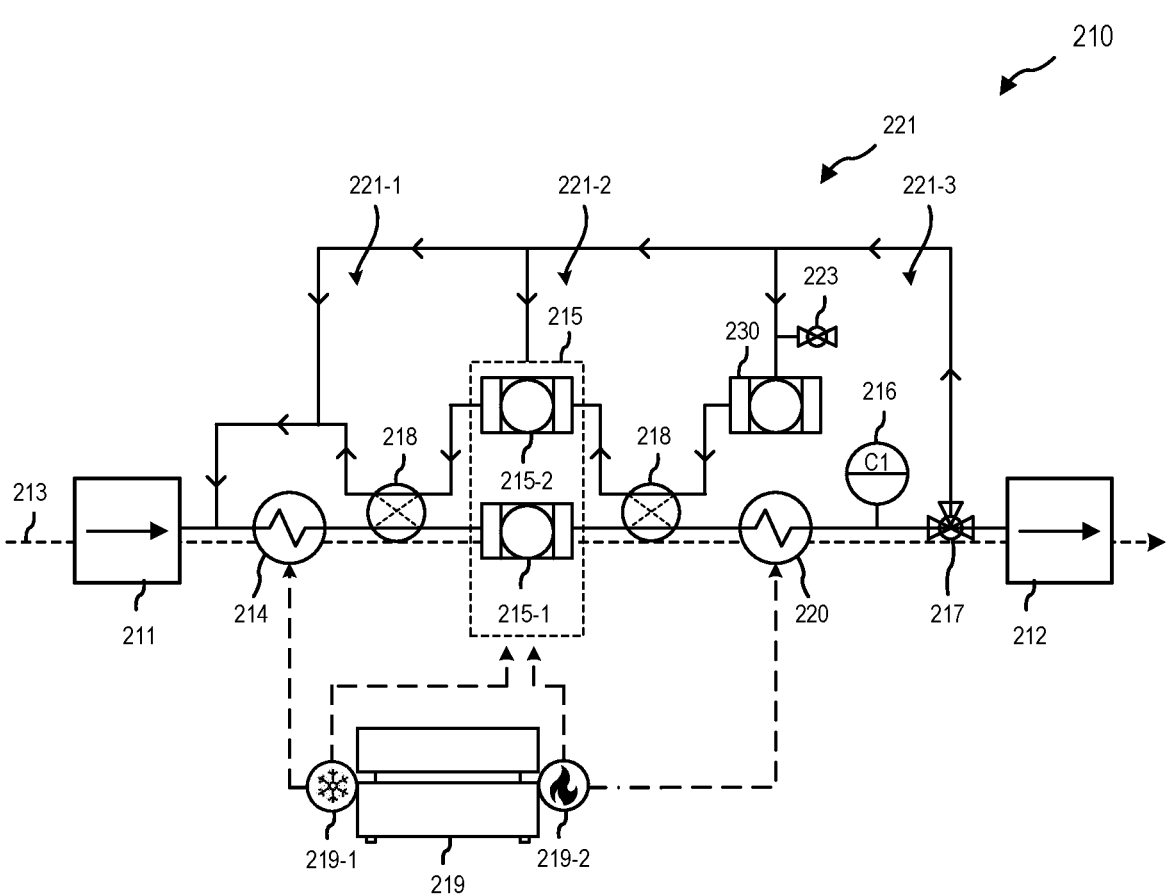

FIG. 2-1 is a process diagram of a vapor recovery system 210, according to at least one embodiment of the present disclosure. The vapor recovery system 210 may include an inlet 211 and an exhaust 212. The inlet 211 may be connected to one or more immersion tanks through a manifold, such as that described in connection with FIG. 1. In some embodiments, the inlet may be a duct, valve, vent, diffuser, vane, plenum, trunk, manifold, any other component capable of directing a fluid flow into the vapor recovery system, or combinations thereof. In this way, the vapor recovery system 210 may receive a fluid vapor from one or more immersion tanks through the inlet 211. In some embodiments, the vapor recovery system 210 may define a fluid path 213 between the inlet 211 and the exhaust 212. For example, the fluid vapor may flow in the inlet 211 and through the vapor recovery system 210 to the exhaust 212. The exhaust 212 may release the fluid vapor out of the vapor recovery system 210. In this way, the fluid path may have a first end and a second end. In some embodiments, the inlet may be located at the first end of the fluid path and the exhaust may be located at the second end of the fluid path. In some embodiments the exhaust 212 may exhaust the fluid vapor to an exterior atmosphere, or to a location external to a data center housing the vapor recovery system 210. In some embodiments, the exhaust 212 may exhaust the fluid vapor to an interior atmosphere, or to a location interior to the data center. In some embodiments, the exhaust may be a duct, valve, vent, diffuser, vane, plenum, trunk, manifold, any other component capable of directing a fluid flow out of the vapor recovery system, and combinations thereof.

In some embodiments, the fluid vapor may be at least partially composed of vaporized working fluid. As discussed herein, the working fluid may be expensive. In some embodiments, the vapor recovery system 210 may include a condenser 214 to recover part or all of the working fluid from the fluid vapor. The condenser 214 may be located on the fluid path 213 between the inlet 211 and the exhaust 212. For example, the fluid vapor may flow in the inlet 211 and to the condenser 214 before flowing to the exhaust 212. The fluid vapor may pass through the condenser 214, and at least a portion of the vaporized working fluid contained in the fluid vapor may be condensed to a liquid in the condenser 214. In some embodiments, the resulting fluid vapor may flow out of the condenser 214 as a processed fluid vapor. The condensed working fluid may be collected and, in some embodiments, returned to the immersion tanks for further use in the cooling system. In some embodiments, the condensed working fluid may be collected and stored in a temporary storage tank. In some embodiments, the condenser may be an air-cooled condenser, water cool-condenser, combined air and water-cooled condenser, evaporative condenser, shell and coil condenser, shell and tube condenser, Peltier thermoelectric cooler, plate frame condenser, any other condenser suitable for condensing the working fluid as described herein, or combinations thereof.

In some embodiments, the condenser 214 may only recover a portion of the working fluid present in the fluid vapor. The portion of the working fluid recovered by the condenser 214 may be a condenser efficiency. In some embodiments, the condenser efficiency may be 85%, or the condenser may recover 85% of the working fluid present in the fluid vapor. In some embodiments, the condenser efficiency may be in a range having an upper value, a lower value, or upper and lower values including any of 20%, 30%, 40%, 50%, 60%, 70%, 80%, 90%, 100%, or any value therebetween. For example, the condenser efficiency may be more than 20%. In another example, the condenser efficiency may be less than 100%. In yet other examples, the condenser efficiency may be between 20% and 100%. In some embodiments, it may be critical that the condenser efficiency be between 85% and 95% in order for the vapor recovery system 210 to recover sufficient working fluid to provide cost savings and to meet exhaust requirements of the fluid vapor. In this way, at least a portion of the working fluid contained in the fluid vapor may be collected and/or recovered with the condenser 214.

In order to effectively remove the working fluid from the fluid vapor, in some embodiments the condenser 214 may operate at a condenser temperature. For example, the condenser 214 may operate at a condenser temperature of 1° C. In some embodiments, the condenser temperature may be in a range having an upper value, a lower value, or upper and lower values including any of −40° C., −30° C., −20° C., −10° C., 0° C., 10° C., 20° C., or any value therebetween. For example, the condenser temperature may be greater than −40° C. In another example, the condenser temperature may be less than 20° C. In yet other examples, the condenser temperature may be between −40° C. and 20° C. In some embodiments, it may be critical that the condenser temperature be between 1° C. and 10° C. to ensure efficient condensing of the working fluid while avoiding the development of frost on the coils of the condenser 214.

In some embodiments, only a portion of the working fluid contained in the fluid vapor may be condensed and recovered by the condenser 214. As discussed herein, the working fluid may be hazardous to health if inhaled or exposed to. In some embodiments, the vapor recovery system 210 may include a scrubber 215. The scrubber may be located on the fluid path between the inlet 211 and the exhaust 212. For example, the fluid vapor leaving the condenser 214 may pass through the scrubber 215 before flowing to the exhaust 212. In some embodiments, the scrubber 215 may remove at least a portion of the remaining working fluid from the fluid vapor to create a processed fluid vapor In some embodiments, the scrubber may be a wet scrubber, dry scrubber, spray tower scrubber, atomizing scrubber, adsorbent bed scrubber, any other scrubber suitable for capturing the working fluid as described herein, or combinations thereof. In accordance with at least one embodiment of the present disclosure, the scrubber 215 may include an adsorbent such as an adsorbent bed, and at least a portion of the working fluid may become deposited on one or more surfaces of the adsorbent. The adsorbent may be silica gel, activated alumina, a molecular sieve, activated carbon, zeolites, polymeric adsorbents, any other adsorbent suitable for adsorbing the working fluid as described herein, and combinations thereof.

Figures 2, 3:
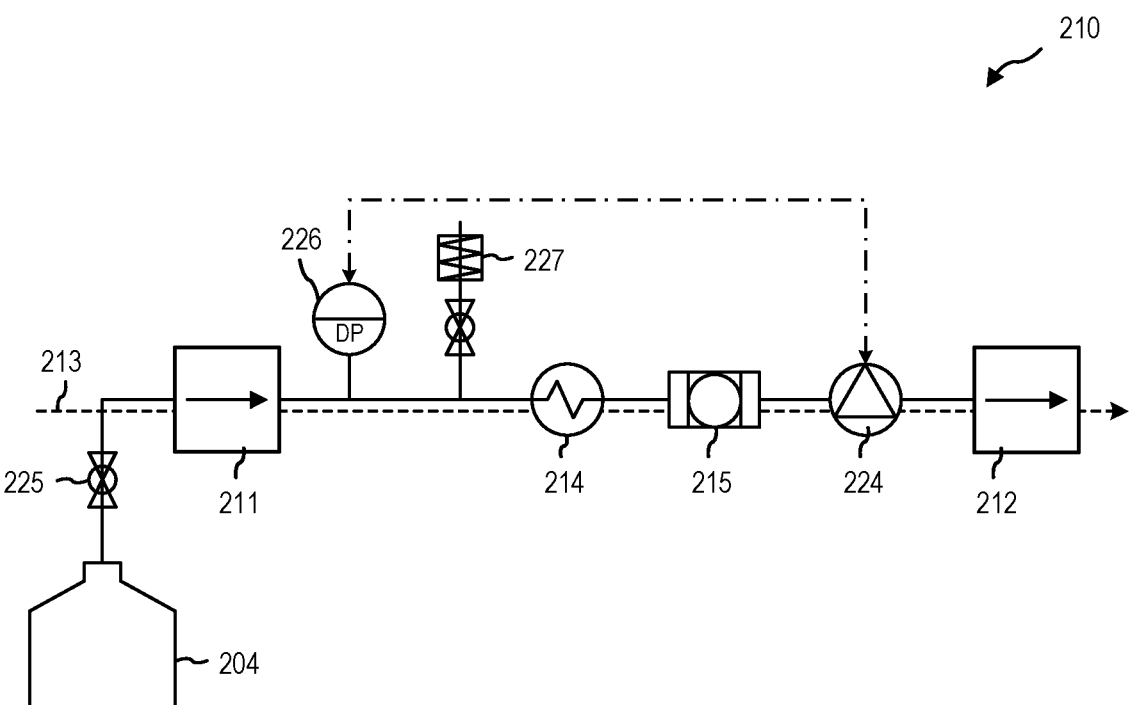

In some embodiments, the adsorbent may be selected based on the working fluid used in the data center's cooling system. In some embodiments, the size, amount, and/or volume of adsorbent and/or adsorbent bed may be selected based on the working fluid used, or based on one or more other parameters of the vapor recovery system 210. For example, the graph in FIG. 3 illustrates an adsorption curve of an example adsorbent that may be selected to be used in association with the vapor recovery system 210 based on a selected working fluid. As illustrated in FIG. 3, based on a partial pressure of the vaporized working fluid in the fluid vapor, an amount of adsorbent (e.g., grams) may be determined in order to remove each unit (e.g., grams) of vaporized working fluid from the fluid vapor. In this way, an adsorbent may be selected based on the specific properties of the adsorbent with respect to the working fluid (e.g., the adsorption curve for the specified adsorbent), and the scrubber 215 may remove at least a portion of the working fluid remaining in the fluid vapor.

In order to effectively remove the working fluid from the fluid vapor, in some embodiments the scrubber 215 may operate at a scrubber temperature. For example, the scrubber 215 may operate at a scrubber temperature that is substantially the condenser temperature. In another example, the scrubber 215 may operate at a scrubber temperature that is substantially an ambient or room temperature (e.g., 25° C.). In some embodiments, the scrubber temperature may be in a range having an upper value, a lower value, or upper and lower values including any of −40° C., −30° C., −20° C., −10° C., 0° C., 10° C., 20° C., 30° C., or any value therebetween. For example, the scrubber temperature may be greater than −40° C. In another example, the scrubber temperature may be less than 30° C. In yet other examples, the scrubber temperature may be between −40° C. and 30° C. In some embodiments, it may be critical that the scrubber temperature be between 1° C. and 25° C. to ensure adequate removal of the working fluid from the fluid vapor down to an acceptable amount.

In some embodiments, the vapor recovery system 210 may include a composition sensor 216. The composition sensor 216 may be located on the fluid path 213 between the scrubber 215 and the exhaust 212. The composition sensor may determine a composition of the fluid vapor, and more specifically, may determine an amount of working fluid in the fluid vapor. For example, the fluid vapor may exit the scrubber 215 and the composition sensor 216 may determine an amount of working fluid remaining in the fluid vapor after passing through the scrubber 215. In some embodiments, the composition sensor 216 may determine a composition of the processed working fluid as described herein. This may correspond to an amount of working fluid that the scrubber removed from the fluid vapor.

In some embodiments, the scrubber 215 may remove the working fluid from the fluid vapor down to a working fluid threshold. The working fluid threshold may be a an amount of the working fluid in the fluid vapor that is acceptable for exhausting to the atmosphere. In some embodiments, the working fluid threshold may be an amount of the working fluid in the processed fluid vapor, as described herein, that is acceptable for exhausting to the atmosphere. For example, the working fluid threshold may be 10 parts per million ("ppm"). In some embodiments, the working fluid threshold may be in a range having an upper value, a lower value, or upper and lower values including any of 0 ppm, 5 ppm, 10 ppm, 15 ppm, 20 ppm, 25 ppm, 30 ppm, 35 ppm, 40 ppm, 45 ppm, 50 ppm, or any value therebetween. For example, the working fluid threshold may be more than 0 ppm. In another example, the working fluid threshold may be less than 50 ppm. In yet other examples, the working fluid threshold may be between 0 and 50 ppm. In some embodiments, it may be critical that the working fluid threshold be between 0 and 10 ppm in order to meet requirements for the release of the fluid vapor to the atmosphere. In some embodiments, the working fluid threshold may be dependent on the type of working fluid used in the vapor recovery system 210. For example, in some implementations, the working fluid used may warrant a working fluid threshold up to 10,000 ppm. In this way, the scrubber 215 may remove at least a portion of the working fluid from the fluid vapor.

FIG. 2-2 is a process diagram of the vapor recovery system 210 of FIG. 2-1. As discussed herein, the vapor recovery system 210 may include an inlet 211 and an exhaust 212, and may define a fluid path 213 flowing from the inlet 211 to the exhaust 212. The vapor recovery system 210 may include a condenser 214, a scrubber 215, and a composition sensor 216 each located on the fluid path 213 between the inlet 211 and the exhaust 212.

As discussed herein, the vapor recovery system 210 may determine a composition of the fluid vapor with the composition sensor 216. In some embodiments, the vapor recovery system 210 may include a composition valve 217 located on the fluid path 213 between the scrubber 215 and the exhaust 212. The composition valve 217 may be associated with the composition sensor 216. The composition valve 217 may operate between an exhaust position and a loop position, and the position of the composition valve 217 may be determined based on a composition of the fluid vapor determined by the composition sensor 216. For example, if the composition sensor 216 determines that an amount of working fluid in the fluid vapor leaving the scrubber 215 is at or below the working fluid threshold, the composition valve 217 may be configured in the exhaust position, and the fluid vapor may be directed to the exhaust 212. In another example, if the composition sensor 216 determines that the amount of working fluid in the fluid vapor leaving the scrubber 215 is above the working fluid threshold, the composition valve 217 may be configured in the loop position, and the fluid vapor may be directed to a composition loop 221 of the vapor recovery system 210. As will be discussed herein, in some embodiments, the composition loop 221 may help to remove more of the working fluid from the fluid vapor. In this way, the vapor recovery system 210 may exhaust the fluid vapor based on a composition of the fluid vapor in order to exhaust the working fluid at an acceptable level.

As shown in FIG. 2-2, in some embodiments the scrubber 215 may be comprised of two or more scrubber units. For example, the scrubber 215 may comprise a first scrubber 215-1 and a second scrubber 215-2. The vapor recovery system 210 may include one or more scrubber valves 218 associated with the scrubber 215. Put another way, the scrubber valves 218 may be located on the fluid path 213 both upstream and downstream of the scrubber 215. The scrubber valves 218 may direct the fluid path 213 through either the first scrubber 215-1 or the second scrubber 215-2, and/or may remove or isolate the first scrubber 215-1 or the second scrubber 215-2 from the fluid path 213. For example, as shown in FIG. 2-2, the scrubber valves 218 are 4-way valves and may direct the fluid path 213 such that the fluid path 213 flows from the condenser 214, through the first scrubber 215-1, and towards the exhaust 212. In this way, the first scrubber 215-1 may be an active scrubber, or may be actively used to remove working fluid from the fluid vapor flowing along the fluid path 213. The scrubber valves 218 may isolate the second scrubber 215-2 from the fluid path such that the second scrubber 215-2 may be an inactive scrubber. In another example, the scrubber valves 218 may direct the fluid path 213 such that the fluid path 213 flows from the condenser 214, through the second scrubber 215-2, and toward the exhaust 212. In this way, the second scrubber 215-2 may be an active scrubber. The scrubber valves 218 may isolate the first scrubber 215-1 from the fluid path such that the first scrubber 215-1 may be an inactive scrubber.

A scrubber unit of the scrubber 215 may be inactive for any number of reasons. For example, a demand of the vapor recovery system 210 may only require some of the scrubber units to be active, and one or more scrubber units may remain inactive. In some embodiments, one or more scrubber units may be inactive due to the scrubber unit being filled, substantially adsorbed, or incapable of effectively removing working fluid from the fluid vapor. For example, the scrubber 215 may be comprised of disposable or consumable scrubber units, and a scrubber unit may be inactive so that it can be replaced with a new scrubber unit. In another example, a scrubber unit may be inactive so that it can be desorbed in preparation for being active at a later time, as will be described herein. In some embodiments, one or more scrubber units of the scrubber 215 may be inactive for purposes of maintenance of one or more other components of the vapor recovery system 210.

In some embodiments, the scrubber 215 may include any number of scrubber units, and any number of scrubber valves 218 may be associated with the scrubber 215. For example, the scrubber 215 may include 1, 2, 3, 4, 5, 6, 7, 8, 9, 10, or more scrubber units, and the vapor recovery system 210 may include any number of scrubber valves 218 in order to accommodate the various scrubber units as discussed herein. In some embodiments, the scrubber valves 218 may direct the fluid path 213 through two or more scrubber units simultaneously, such that two or more scrubber units may be active. This may be in response to a demand on the vapor recovery system 210 to remove working fluid from the fluid vapor at a higher rate. In some embodiments, the scrubber valves 218 may direct the fluid path 213 such that two or more scrubber units may be inactive simultaneously. This may be in response to one or more scrubber units needing to be replaced or desorbed as discussed herein. In this way, one or more scrubber units may be activated and/or inactivated by the scrubber valves 218 in order to respond to the needs of the vapor recovery system 210.

In some embodiments, the vapor recovery system 210 may include a chiller 219. The chiller 219 may generate one or more chilled glycol loops 219-1. For example, the chilled glycol loops 219-1 may utilize glycol or a refrigerant. In some embodiments, the chiller 219 may be connected to the condenser 214 such that the chiller 219 and the condenser 214 are in thermal communication. For example, the chilled glycol loop 219-1 may be directed to one or more coils of the condenser 214. This may facilitate the removal of the working fluid from the fluid vapor as discussed herein. In some embodiments, the chiller may cause the condenser to operate at the condenser temperature as described herein. In some embodiments, the chiller 219 may be connected to and/or in thermal communication with the scrubber 215. For example, the chilled glycol loop 219-1 may be directed to one or more active scrubber units of the scrubber 215. This may facilitate the removal of the working fluid from the fluid vapor as discussed herein. In some embodiments, the chiller 219 may cause the active scrubber of the scrubber 215 to operate at the scrubber temperature as discussed herein. In this way, the chiller 219 may direct one or more chilled glycol loops 219-1 to one or more components to facilitate capture of the working fluid.

As discussed herein, the condenser 214 and/or the scrubber 215 may operate at a cooled temperature. This may cause the fluid vapor to exit the condenser 214 and/or the scrubber 215 at a cooled temperature. In some embodiments, the vapor recovery system 210 may include a heat sink 220. The heat sink 220 may be located on the fluid path 213. In some embodiments, the heat sink may be located downstream of the condenser 214 and/or the scrubber 215. The heat sink may serve to at least partially warm the fluid vapor. For example, it may be desirable to warm the fluid vapor to room temperature before it is exhausted from the system to avoid flooding the data center with cool air. In another example, it may be desirable to warm the fluid vapor before it is directed to the composition loop to facilitate better desorption of an inactive scrubber unit of the scrubber 215, as will be discussed herein. In some embodiments, the chiller 219 may include one or more heated glycol loops 219-2. The heated glycol loops may be heated by capturing waste heat from the chilling process of the chiller 219. In some embodiments, the heat sink 220 and the chiller 219 may be in thermal communication. For example, the heated glycol loop 219-2 may be directed at the heat sink 220 in order to provide the heating effect of the heat sink 220. In this way, waste heat from the chiller 219 may be used to heat the fluid vapor.

In some embodiments, the heating effect of the chiller 219 may be in thermal communication with the scrubber 215. For example, the heated glycol loop 219-2 may be directed at one or more inactive scrubber units of the scrubber 215. This may facilitate desorption of the inactive scrubber unit as discussed herein. For example, the heated glycol loop 219-2 may heat one or more of the inactive scrubber unit or the fluid vapor flowing into the inactive scrubber unit. In some embodiments, the heated glycol loop 219-2 may cause the inactive scrubber unit and/or the fluid vapor flowing into the inactive scrubber to operate at a desorption temperature. For example, the desorption temperature may be 50° C. In some embodiments, the desorption temperature may be in a range having an upper value, a lower value, or upper and lower values including any of 40° C., 50° C., 60° C., 70° C., 80° C., or any value therebetween. For example, the desorption temperature may be greater than 40° C. In another example, the desorption temperature may be less than 80° C.

In yet other examples, the desorption temperature may be between 40° C. and 80° C. In some embodiments, it may be critical that the desorption temperature be above 50° C. in order to effectively desorb the inactive scrubber unit of the scrubber 215.

As discussed herein, the composition valve 217 may direct the fluid vapor to the exhaust 212, or alternatively to a composition loop 221. The composition loop 221 may direct the fluid vapor, more specifically the processed fluid vapor, back to one or more components of the vapor recovery system 210. For example, the vapor recovery system 210 may remove more working fluid from the fluid vapor with the condenser 214 and/or the scrubber 215. In another example, the vapor recovery system may use the processed fluid vapor to desorb an inactive scrubber unit of the scrubber 215. As shown in FIG. 2-2, in some embodiments the composition loop 221 may have three optional fluid paths through which the fluid vapor may be directed as will be discussed herein. The three paths may be a first loop path 221-1, a second loop path 221-2, and a third loop path 221-3.

In some embodiments, the composition loop 221 may be configured as the first loop path 221-1. In the first loop path 221-1, the composition loop 221 may be connected directly back to the fluid path 213 between the condenser 214 and the inlet 211. For example, if the composition sensor 216 determines that the working fluid is present in the processed fluid vapor above the working fluid threshold, the first loop path 221-1 may direct the processed fluid vapor directly back into the fluid path 213 before, or upstream of the condenser 214 where it may mix with the fluid vapor in the fluid path 213 at that location. The fluid vapor may then proceed back through the processes of the vapor recovery system 210 described herein to remove more of the working fluid. In this way, the composition loop 221 configured as the first loop path 221-1 may recycle the processed fluid vapor back through the system to ultimately exhaust the working fluid below the working fluid threshold.

In some embodiments, the composition loop 221 may be configured as the second loop path 221-2. In the second loop path 221-2, The composition loop 221 may be connected back to the scrubber 215, or more specifically, to an inactive scrubber unit of the scrubber 215. As shown in FIG. 2-2, the second scrubber 215-2 is depicted as the inactive scrubber, and the second loop path 221-2 is shown as being directed to the second scrubber 215-2. As discussed herein, however, any scrubbers unit of the scrubber 215 may be an inactive scrubber unit, and it should be understood that the second loop path 221-2 may be directed to any of the scrubber units that is an inactive scrubber unit. In some embodiments, as described herein, the inactive scrubber unit may be inactive due to it being full, substantially adsorbed, or incapable of removing the working fluid from the fluid vapor.

In some embodiments, the second loop path 221-2 may be directed to an inactive scrubber unit in order to facilitate desorption of the inactive scrubber. For example, the second loop path 221-2 may direct the processed fluid vapor from the fluid path 213 through the inactive scrubber unit, and working fluid previously captured by the inactive scrubber unit may evaporate into the processed fluid vapor. The processed fluid vapor may then flow out of the inactive scrubber unit and the evaporated working fluid may be carried away with it. In some embodiments, the inactive scrubber unit may be heated to facilitate desorption of the inactive scrubber unit. In some embodiments, the fluid vapor may be heated in order to facilitate desorption of the inactive scrubber unit. In some embodiments, the vapor recovery system 210 may subject the inactive scrubber unit to a vacuum and/or may lower a pressure associated with the inactive scrubber unit in order to facilitate desorption of the inactive scrubber unit. In some embodiments, the vapor recovery system 210 may employ two or more of these methods, or any other method for facilitating desorption of the inactive scrubber unit. In this way, the vapor recovery system 210 may evaporate working fluid previously captured by the inactive scrubber unit into the fluid vapor in order to desorb the inactive scrubber unit in preparation for becoming active again at a later time.

In some embodiments, the second loop path 221-2 may proceed from the inactive scrubber unit back to the fluid path 213 between the inlet 211 and the condenser 214. In other words, the processed fluid vapor may flow from the inactive scrubber unit back into the fluid path upstream of the condenser where it may mix with the fluid vapor in the fluid path 213 at that location. The fluid vapor may then flow through the processes of the vapor recovery system 210 as described herein to remove more working fluid from the fluid vapor. In this way, the second loop path 221-2 may direct working fluid that was otherwise captured by the scrubber 215 back to the condenser 214 where it may be collected and recovered for further use. Also in this way, fluid vapor (such as that which may have already been designated for reprocessing) may be used by the vapor recovery system 210 to desorb an inactive scrubber unit. This may increase an efficiency of the vapor recovery system 210.

In some embodiments, the composition loop 221 may be configured as the third loop path 221-3. In the third loop path 221-3, the composition loop 221 may be connected back to an inactive scrubber unit of the scrubber 215 and may include a secondary inlet 223. The secondary inlet 223 may introduce ambient air into composition loop 221 which may mix with the processed fluid vapor. For example, in some situations the processed fluid vapor directed down the composition loop 221 may be inadequate for effectively desorbing the inactive scrubber unit. This may be due to the processed fluid vapor being overly saturated with working fluid. In some embodiments, the secondary inlet 223 may introduce ambient air into the composition loop 221 in order to supplement the processed fluid vapor, or to increase an ability of the processed fluid vapor to desorb the inactive scrubber unit. In some embodiments, the secondary inlet 223 may introduce ambient air from an interior atmosphere, or from inside the data center. In some embodiments, the secondary inlet 223 may introduce ambient air from an exterior atmosphere.

As described herein, the vapor recovery system 210 may include one or more desiccants 230. In some embodiments, the third loop path 221-3 may include a desiccant 230 downstream of the secondary inlet 223 to remove water vapor from the ambient air introduced through the secondary inlet 223. For example, the ambient air may be mixed with the processed fluid vapor, and the mixture of processed fluid vapor and ambient air may pass through the desiccant 230 to remove water vapor, as shown in FIG. 2-2. In another example, ambient air may enter through the secondary inlet 223 and may flow directly through the desiccant 230 to remove water vapor from the ambient air before being mixed with the processed fluid vapor. In this way, the composition loop 221 may mix or add ambient air to the processed fluid vapor in the third loop path 221-3.

In some embodiments, the third loop path 221-3 may proceed to the inactive scrubber unit, and the processed fluid vapor may be used to desorb the inactive scrubber unit as described herein. The third loop path 221-3 may then proceed from the inactive scrubber unit back to the fluid path 213 between the inlet 211 and the condenser 214, where the processed fluid vapor may mix with the fluid vapor in the fluid path 213 at that location. The fluid vapor may then flow through the processes of the vapor recovery system 210 as describe herein to remove more working fluid from the fluid vapor. In this way, the composition loop 221 configured as the third loop path 221-3 may introduce ambient air into the processed fluid vapor to more effectively desorb the inactive scrubber unit of the scrubber 215. Also in this way, the third loop path 221-3 may direct working fluid that was otherwise captured by the scrubber 215 back to the condenser 214 where it may be collected and recovered for further use.

FIG. 2-3 is a process diagram of the vapor recovery system 210 of FIG. 2-1. As discussed herein, the vapor recovery system 210 may include an inlet 211 and an exhaust 212, and may define a fluid path 213 flowing from the inlet 211 to the exhaust 212. The vapor recovery system 210 may include a condenser 214 and a scrubber 215, each located on the fluid path 213 between the inlet 211 and the exhaust 212.

In some embodiments, the vapor recovery system 210 may include a pump 224. According to at least one embodiment of the present disclosure, the pump 224 may be located on the fluid path between the scrubber 215 and the exhaust 212. In some embodiments, the pump 224 may be located substantially at the exhaust 212. The pump 224 may be located at any other location in the vapor recovery system 210 suitable for operation of the vapor recovery system 210 as described herein. In some embodiments, the vapor recovery system 210 may include two or more pumps 224. For example, a first pump 224 may be located at the exhaust 212 and a second pump 224 may be located on the composition loop 221 as described herein. In another example, a first pump 224 may be located at the exhaust 212 and a second pump 224 may be located at the inlet 211. In this way, one or more pumps may be located at any location in the vapor recovery system 210 suitable for operation of the vapor recovery system 210 as described herein.

In some embodiments, the pump 224 may maintain a fluid flow through one or more portions of the vapor recovery system 210. For example, the pump 224 may maintain a fluid flow along the fluid path 213. In another example, the pump may maintain a fluid flow along the composition loop 221. The pump may be an exhaust fan, a blower, an impeller, an axial fan, a centrifugal fan, any other type of fan or pump suitable for creating and/or maintaining a fluid flow through one or more portions of the vapor recovery system 210 as described herein, or combinations thereof.

In at least one embodiment of the present disclosure, the pump 224 may be located on the fluid path 213 substantially at the exhaust 212. The pump 224 may be a forced-air pump and may force a fluid flow out of the exhaust 212. Put another way, the pump 224 may create a suction at or near the exhaust 212. This may cause an exhaust pressure at or near the exhaust 212 to be lower than a pressure of one or more components or locations in the vapor recovery system 210. For example, the pump 224 may create a negative pressure in or at the exhaust 212, and fluid vapor located at the inlet 211, the condenser 214, the scrubber 215, and/or any other component may flow along the fluid path 213 to the exhaust due to a suction of the pump 224. In this way, the vapor recovery system 210 may create and maintain a fluid flow along the fluid path 213. In some embodiments, the fluid flow may be constant along the fluid path, as will be discussed herein.

In some embodiments, the vapor recovery system 210 may determine a pressure of one or more components or locations of the vapor recovery system 210. For example, the vapor recovery system 210 may determine a pressure at one or more of the inlet 211, the condenser 214, the scrubber 215, the pump 224, the exhaust 212, any other location, or combinations thereof. In some embodiments, a pressure differential may be determined between various components or locations of the vapor recovery system 210. For example, a pressure differential between the inlet 211 and the exhaust 212 may be determined. In another example, a pressure differential between the condenser 214 and the exhaust 212 may be determined. In yet other examples, a pressure differential of the fluid path 213 before and after the scrubber 215 may be determined. In this way the vapor recovery system 210 may determine the pressure at various locations in order to monitor one or more operating parameters of the vapor recovery system 210.

According to at least one embodiment of the present disclosure, the vapor recovery system 210 may include a differential pressure sensor 226 to determine a pressure differential between the exhaust pressure and an inlet pressure at or near the inlet 211. As discussed herein, the inlet 211 may be located at a first end of the fluid path 213 and the exhaust 212 may be located at a second end of the fluid path 213. In other words, the vapor recovery system 210 may accordingly determine a pressure differential between the first end of the fluid path 213 and the second end of the fluid path 213. For example, the differential pressure sensor 226 may include one or more pressure sensors at the exhaust 212 and/or the inlet 211 to determine the pressure differential between the exhaust pressure and the inlet pressure.

In some embodiments, the vapor recovery system 210 may maintain the differential pressure between the exhaust pressure and the inlet pressure. In other words, the vapor recovery system 210 may maintain the pressure differential between the first end of the fluid path 213 and the second end of the fluid path 213. For example, the pump 224 may be a variable speed pump, and the vapor recovery system 210 may control a speed of the pump 224 in order to maintain the pressure differential. In other words, the vapor recovery system 210 may control a speed of the pump 224 based on the pressure differential. In this way, the vapor recovery system 210 may determine and maintain a pressure differential between the exhaust pressure and the inlet pressure in order to create and maintain a fluid flow along the fluid path 213. In some embodiments, the vapor recovery system 210 may control and/or alter one or more other parameters of the pump 224 and/or other components in order to maintain the pressure differential and/or fluid flow.

In some embodiments, the pressure differential between the exhaust pressure and the inlet pressure may be a negative pressure differential. In other words, the pressure differential between the second end of the fluid path 213 and the first end of the fluid path 213 may be a negative pressure differential. For example, the exhaust pressure may be less than the inlet pressure. In some embodiments, the negative pressure differential between the exhaust pressure and the inlet pressure may be 200 Pa. In other words, the exhaust pressure may be 200 Pa less than the inlet pressure. In some embodiments, the negative pressure differential may be in a range having an upper value, a lower value, or upper and lower values including any of 50 Pa, 100 Pa, 200 Pa, 300 Pa, 400 Pa, 500 Pa, 1000 Pa, 1500 Pa, 2000 Pa, or any value therebetween. For example, the negative pressure differential may be greater than 50 Pa. In another example, the negative pressure differential may be less than 300 Pa. In yet other examples, the negative pressure differential may be between 50 Pa and 300 Pa. In some embodiments, it may be critical that the negative pressure differential be between 200 Pa and 300 Pa in order to maintain an adequate fluid flow between the inlet 211 and the exhaust 212.

In some embodiments, the pump may cause the exhaust pressure to be 200 Pa lower than an ambient or atmospheric pressure. In other words, the exhaust pressure may be −200 Pa relative to ambient pressure. In some embodiments, the exhaust pressure may be in a range having an upper value, a lower value, or upper and lower values including any of −50 Pa, −100 Pa, −150 Pa, −200 Pa, −250 Pa, −300 Pa, or any value therebetween, relative to ambient pressure. For example, the exhaust pressure may be more than 50 Pa below ambient pressure. In another example, the exhaust pressure may be less than 300 Pa below ambient pressure. In yet other examples, the exhaust pressure may be between 50 Pa and 300 Pa below ambient pressure. In some embodiments, it may be critical that the exhaust pressure be between 200 and 300 Pa below ambient pressure in order to create an effective fluid flow along the fluid path and/or through the various components of the vapor recovery system 210 as described herein. This may also be critical in order to eliminate leaks at or near the inlet, as well as to facilitate evaporating condensation at the inlet.

In some embodiments, the vapor recovery system 210 may maintain an entirety of the system below a critical pressure. For example, a pressure at the inlet 211, the condenser 214, the scrubber 215, the pump 224, the exhaust 212, or any other location may each be distinct pressures, but each pressure may be less than the critical pressure. Put another way, a fluid path pressure of the fluid path may be maintained below the critical pressure. In some embodiments, the critical pressure may be below atmospheric pressure. As described herein, the working fluid may be dangerous to health, and the critical pressure may serve to prevent vaporized working fluid from escaping the immersion tanks and/or the vapor recovery system. For example, if a leak or breach occurs at one or more locations of the vapor recovery system 210, the critical pressure being negative relative to atmospheric pressure may cause ambient air to rush into the system instead of vaporized working fluid escaping. In this way, the critical pressure at all locations of the vapor recovery system 210 may act as a failsafe to prevent vaporized working fluid from escaping the system.

In some embodiments, the critical pressure may be −50 Pa, or in other words the vapor recovery system 210 may be maintained at 50 Pa below atmospheric pressure at all locations. In some embodiments, the critical pressure may be in a range having an upper value, a lower value, or upper and lower values including any of −10 Pa, −20 Pa, −30 Pa, −40 Pa, −50 Pa, −60 Pa, −70 Pa, −80 Pa, −90 Pa, −100 Pa, −200 Pa, or any value therebetween, relative to the atmosphere. For example, the critical pressure may be more than 10 Pa below atmospheric pressure. In another example, the critical pressure may be less than 200 Pa below atmospheric pressure. In yet other examples, the critical pressure may be between 10 Pa and 200 Pa below atmospheric pressure. In some embodiments, it may be critical that the critical pressure be between 10 Pa and 30 Pa below atmospheric pressure to ensure that vaporized working fluid doesn't escape while maintaining effective operation of the components of the vapor recovery system 210.

As discussed herein, the inlet 211 of the vapor recovery system 210 may be connected to one or more immersion tanks 204. The vapor recovery system 210 may receive fluid vapor including working fluid from the immersion tanks

204. In some embodiments, the immersion tank may be connected to the inlet 211 through one or more tank valves 225. The tank valves 225 may isolate one or more of the immersion tanks 204 from the vapor recovery system 210. In other words, the vapor recovery system 210 and the immersion tanks 204 may not be constantly in fluid communication. For example, the immersion tanks 204 may operate in a data center and may employ a two-phase immersion cooling system as discussed herein. Periodically, the immersion tanks 204 may release a volume of fluid vapor to the vapor recovery system 210 through the tank valves 225. This may be in response to an excess of fluid vapor and/or vaporized working fluid creating a pressure in the immersion tanks 204. This may also be in preparation for a door of the immersion tank 204 being opened.

In some embodiments, the tank valves 225 may include one or more actuated valves. For example, the tank valves 225 may be manually or automatically actuated in order to release fluid vapor from the immersion tanks 204 to the vapor recovery system 210. In some embodiments, the tank valves 225 may include one or more pressure release valves. For example, the tank valves 225 may be mechanical or automatic valves that may release fluid vapor from the immersion tanks 204 based on a tank pressure of the immersion tanks reaching or surpassing a predetermined threshold. In this way, the tank valves 225 and/or the vapor recovery system 210 may act as a safety mechanism against over pressuring of the immersion tanks 204. In some embodiments, one or more immersion tanks 204 may be connected to each other through one or more valves. For example, a first immersion tank 204 may release fluid vapor to a second immersion tank 204 in order to equalize a pressure of one or more of the immersion tanks 204. In this way, pressure and/or fluid vapor from one or more immersion tanks may be released to the vapor recovery system 210 to prevent vaporized working fluid from escaping to the atmosphere.

As discussed herein, an inlet pressure at the inlet 211 may be maintained at a negative pressure. This may cause fluid vapor to flow from the immersion tanks 204 and into the inlet 211. In this way, the vapor recovery system 210 may control a tank pressure of the immersion tanks 204. In some embodiments, it may be critical that the tank pressure be below atmospheric pressure. For example, the tank pressure being below atmospheric pressure may prevent fluid vapor from escaping the immersion tanks when the immersion tank door is opened, as described herein. In some embodiments, the tank pressure may only be slightly negative. For example, the negative tank pressure may be in such an amount as to prevent fluid vapor from escaping when a door of the immersion tank is open, but not so much as to create a vapor lock or suction lock which would prevent the door from being opened at all. In this way, the negative pressure of the inlet 211 and of the vapor recovery system 210 may prevent vaporized working fluid from escaping the immersion tank 204.

As discussed herein, the immersion tanks 204 may periodically release a volume of fluid vapor to the vapor recovery system 210. In some embodiments, the vapor recovery system 210 may include a gas expansion system 227. The gas expansion system 227 may be located on the fluid path 213 between the inlet 211 and the condenser 214. In some embodiments, the gas expansion system 227 may receive a volume of fluid vapor from the fluid path 213. For example, the gas expansion system 227 may include one or more bags or tanks for receiving a volume of fluid vapor. In this way, the immersion tanks 204 may release a volume of fluid vapor into the vapor recovery system 210, and at least a portion of the volume of fluid vapor may flow into the gas expansion system 227. This may be in response to an excess load on the vapor recovery system 210. For example, one or more components such as the condenser 214 and/or the scrubber 215 may be configured to operate at a certain flow rate of fluid vapor. If the volume of fluid vapor released by the immersion tanks 204 causes the flow rate along the fluid path 213 to surpass a certain amount, some or all of the volume of fluid vapor may flow into the gas expansion system 227.

In some embodiments, some or all of the fluid vapor held in the gas expansion system may be released back into the fluid path 213. In some embodiments, the gas expansion system 227 may release the fluid vapor at a constant flow rate. For example, the gas expansion system 227 may slowly and consistently release the fluid vapor to the fluid path 213 in order to accommodate a preferred or a working flow rate of one or more components of the vapor recovery system 210. In some embodiments, fluid vapor may flow along the fluid path 213 without flowing into the gas expansion system 227. For example, the gas expansion system 227 may include a valve that may be actuated in order to selectively connect or isolate the gas expansion system 227 from the fluid path 213. In this way, the gas expansion system 227 may provide a constant flow rate of the fluid path 213 in order to ensure that one or more components of vapor recovery system 210 function properly.

Figures 2, 3, 4:
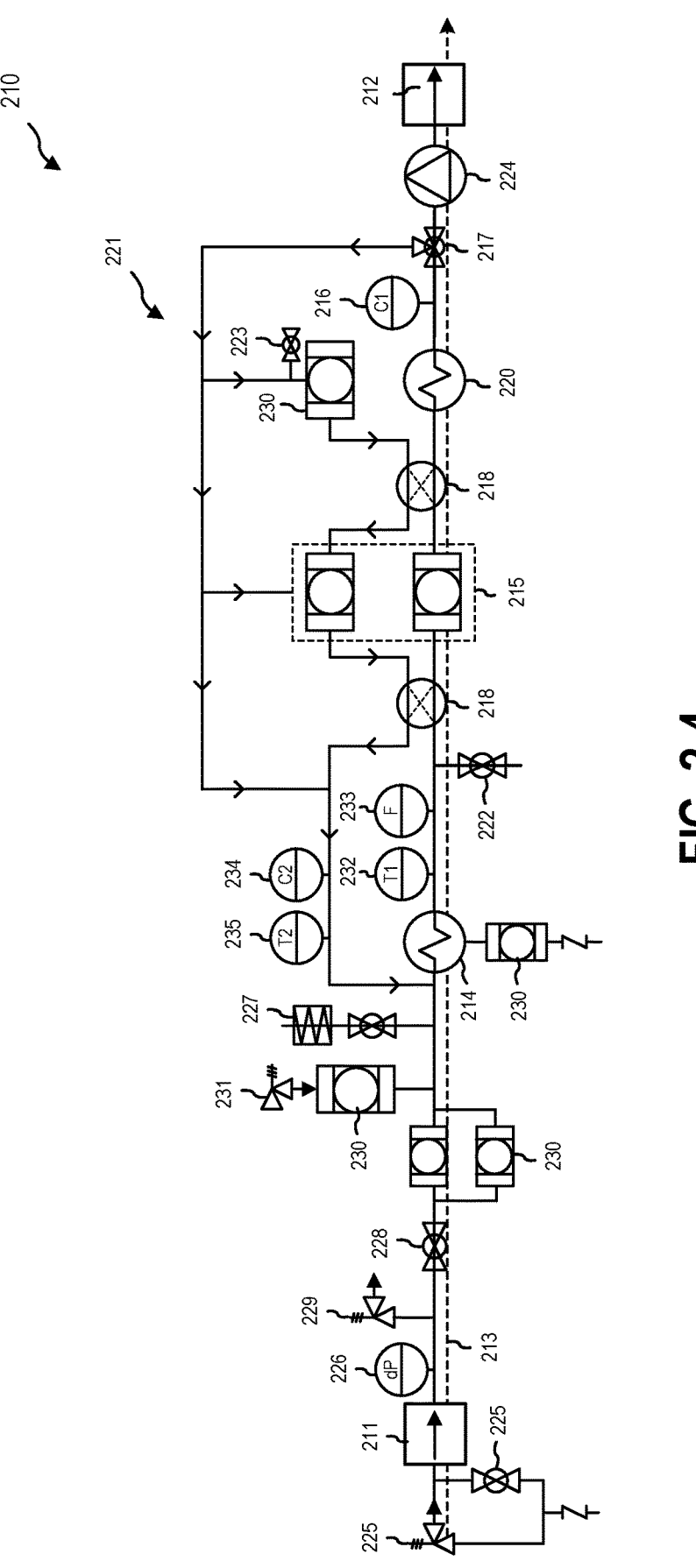
Figure 3:
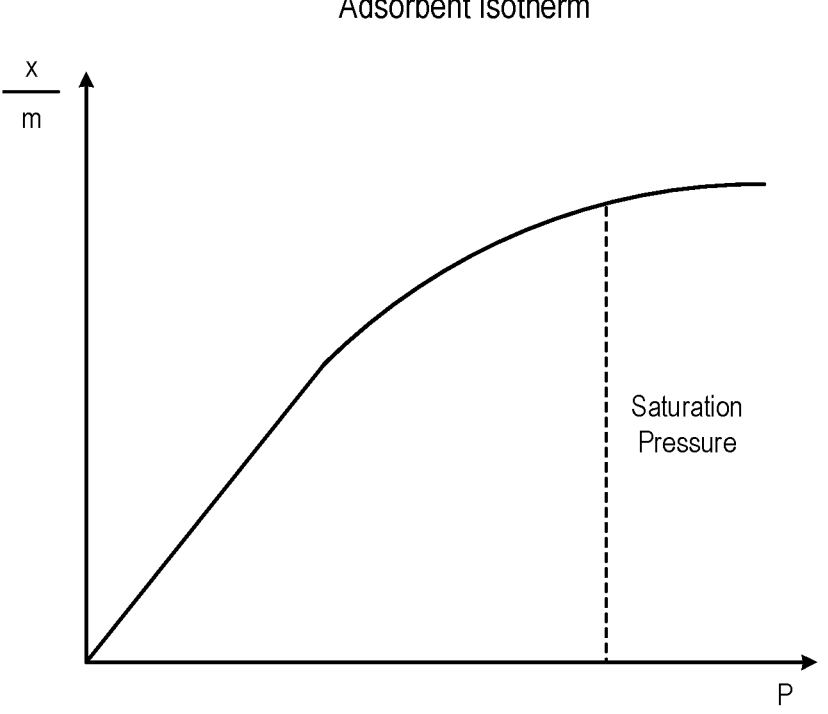
Figure 4:
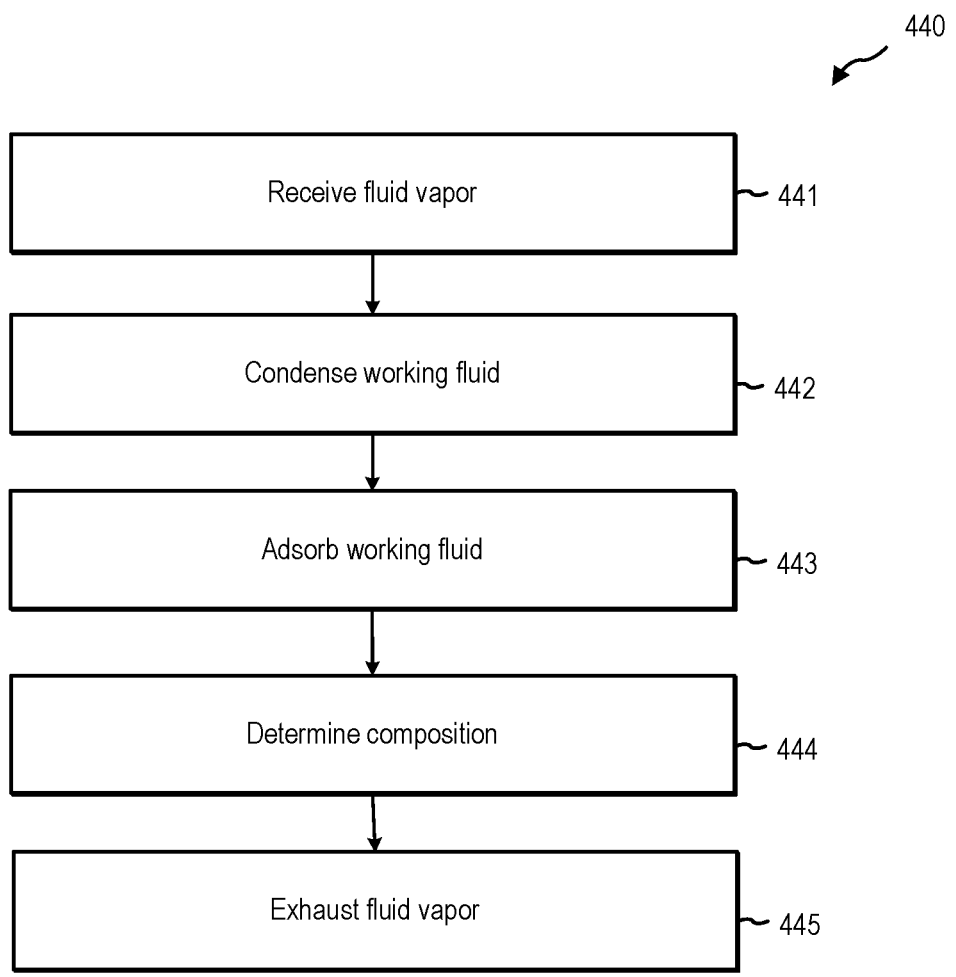

FIG. 2-4 is a process diagram of the vapor recovery system 210 of FIG. 2-1. The vapor recovery system 210 may include one or more of the various features and embodiments described herein in connection with FIGS. 2-1, 2-2, and 2-3.

In some embodiments, the vapor recovery system 210 may include a pressure safety valve 229. The pressure safety valve 229 may be located on the fluid path 213 at or near the inlet 211. In some embodiments the pressure safety valve 229 may be configured to exhaust a fluid flow to the exterior atmosphere. For example, the pressure safety valve 229 may be connected to the exhaust 212 or to any other component that exhausts to the exterior atmosphere. In some embodiments, the pressure safety valve 229 may be automatically actuated based on a pressure of the vapor recovery system 210. For example, an excess of pressure at one or more locations in the vapor recovery system 210 may cause the pressure safety valve 229 to actuate, either mechanically or electronically, and fluid vapor in the fluid path 213 may be released directly to the exterior atmosphere. This may be a safety feature to prevent exposure to the working fluid. For example, a malfunction of one or more components of the vapor recovery system 210 may cause a build-up of pressure at or above the critical pressure. In another example, the vapor recovery system 210 may not be able to handle a surge or an excess volume of fluid vapor released by the immersion tanks 204, possibly due to the gas expansion system being full. In some embodiments, the pressure safety valve 229 may be manually or electronically actuated for any other purpose to release fluid vapor directly to the atmosphere.

In some embodiments, the vapor recovery system 210 may include an isolation valve 228. The isolation valve 228 may be located on the fluid path 213 between the pressure safety valve 229 and the gas expansion system 227. The isolation valve 228 may be selectively actuated to isolate the downstream portions of the vapor recovery system 210. In other words, the isolation valve 228 may be closed to effectively take the vapor recovery system 210 offline. For example, the vapor recovery system 210 may be taken offline in order to perform maintenance of one or more components of the vapor recovery system 210. The isolation valve 228 may be located on the fluid path 213 downstream of the pressure safety valve 229. In this way, when the isolation valve 228 is closed, fluid vapor released from the immersion tanks 204 may be exhausted through the pressure safety valve 229. This may prevent a build-up of fluid vapor in the immersion tanks 204 that could lead to exposure to the working fluid.

In some embodiments, the vapor recovery system 210 may include a pressure safety inlet 231. In accordance with at least one embodiment of the present disclosure, the pressure safety inlet 231 may connect to the fluid path at a location between the inlet 211 and the gas expansion system 227. In some embodiments, the pressure safety inlet 231 may connect to the fluid path at any other location along the fluid path. The pressure safety inlet 231 may be configured to allow ambient air to flow into the fluid path 213. In some embodiments, the ambient air may be ambient air internal to the data center. In some embodiments, the ambient air may be ambient air external to the data center. In some embodiments, the pressure safety inlet 231 may include a pressure safety valve. For example, the pressure safety inlet 231 may automatically allow ambient air to flow into the fluid path 213 based on a pressure of one or more locations of the fluid path 213. In another example, the pressure safety inlet 231 may include a valve that may be selectively actuated to let ambient air flow into the fluid path 213 for any other reason. In this way the pressure safety inlet 231 may help to control a pressure at one or more locations of the fluid path.

The fluid vapor may contain one or more materials or fluids in addition to vaporized working fluid, such as water vapor. As discussed herein, the vapor recovery system 210 may include one or more desiccants 230. In some embodiments, a desiccant 230 may be located on the fluid path 213 between the inlet 211 and the condenser 214. The fluid vapor may flow through the desiccant 230 and at least some water vapor may be removed from the fluid vapor by the desiccant 230. In some embodiments, two or more desiccants 230 may be located on the fluid path 213 before the condenser 214. For example, the vapor recovery system 210 may employ multiple desiccants 230 when experiencing a higher demand on the vapor recovery system 210 to process fluid vapor. In another example, two or more desiccants 230 may facilitate maintenance or replacement of one desiccant 230 while the other is operating to remove water vapor. In this way, the desiccant 230 may remove water vapor from the fluid vapor that is received through the inlet 211. This may result in the fluid vapor flowing into the condenser 214 with a higher concentration of working fluid and/or a lower concentration of water. This may help to reduce the amount of water that is condensed in the condenser 214 along with the working fluid. As discussed herein, the condensed liquid from the condenser 214 may be collected and returned to the immersion tanks 204, or may be collected and stored in a temporary storage tank. In some embodiments, the liquid condensed in the condenser 214 may be passed through a desiccant 230. In this way, water vapor may be further removed from the collected working fluid.

In some embodiments, the vapor recovery system 210 may include a desiccant 230 associated with the pressure safety inlet 231. For example, the desiccant 230 may be located between the pressure safety inlet 231 and the fluid path. The ambient air being introduced through the pressure safety inlet 231 may pass through the desiccant 230 before entering the fluid path 213. In this way, water vapor may be removed from the ambient air before it is mixed with the fluid vapor in order to collect higher concentrations of working fluid and/or lower concentrations of water as discussed herein.

In some embodiments, the vapor recovery system 210 may include a temperature sensor 232. The temperature sensor 232 may be located on the fluid path 213 downstream of the condenser 214. For example, the temperature sensor 232 may determine a temperature of the processed fluid vapor flowing out of the condenser 214. As discussed herein, the condenser 214 may operate at a condenser temperature. In some embodiments, the temperature sensor 232 may help to determine one or more parameters associated with an operation of the condenser 214, such as the condenser temperature, in order to adjust or modify one or more parameters of the vapor recovery system 210. In this way, the temperature sensor 232 may help to increase an efficiency of the condenser 214.

In some embodiments, the vapor recovery system 210 may include a flow sensor 233. The flow sensor 233 may be located on the fluid path 213 downstream of the condenser 214. For example, the flow sensor 233 may determine a flow rate of the processed fluid vapor flowing out of the condenser 214. In some embodiments, the condenser may operate at a desired flow rate or a working flow rate. The flow sensor 233 may help to determine the flow rate of the fluid vapor through the condenser 214 in order to adjust or modify (e.g., with the gas expansion system 227) the flow rate of the fluid vapor along the fluid path 213. In this way, the flow sensor 233 may help to increase an efficiency of the condenser 214. In some embodiments, the flow sensor 233 may help to determine the flow rate of the fluid vapor through the scrubber 215. This may help to determine when an active scrubber unit of the scrubber 215 is full or substantially adsorbed and needs to be switched with an inactive scrubber unit of the scrubber 215.

In some embodiments, the vapor recovery system 210 may include a sample valve 222. In at least one embodiment of the present disclosure, the sample valve 222 may be located on the fluid path 213 between the condenser 214 and the scrubber 215. In some embodiments, the sample valve 222 may be located at any other location in the vapor recovery system 210. The sample valve 222 may be configured to allow at least a portion of the fluid vapor to flow out of the fluid path 213. For example, in some embodiments it may be desirable to take a sample of the processed fluid vapor for quality or testing purposes.

In some embodiments, the vapor recovery system may include a secondary composition sensor 234. The secondary composition sensor 234 may be located on the composition loop 221. The secondary composition sensor 234 may determine a composition of the fluid vapor, and more specifically, may determine an amount of working fluid present in the processed fluid vapor. For example, the composition sensor 216 may determine that the composition of the processed fluid vapor has an amount of working fluid that is above the working fluid threshold, and the secondary composition sensor 234 may again determine the composition after the processed fluid vapor has passed through one or more of the components or processes of the composition loop 221, as described herein. In another example, the processed fluid vapor may be used to desorb an inactive scrubber unit of the scrubber 215, and the secondary composition sensor 234 may help to determine when the inactive scrubber unit has been fully or substantially desorbed. In this way, the secondary composition sensor 234 may determine a composition of the processed fluid vapor flowing through the composition loop 221.

In some embodiments, the vapor recovery system may include a secondary temperature sensor 235. The secondary temperature sensor 235 may be located on the composition loop 221. For example, the secondary temperature sensor 235 may determine a temperature of the processed fluid vapor flowing through the composition loop. As discussed herein, desorption of the inactive scrubber unit of the scrubber 215 may occur at a desorption temperature. In some embodiments, the secondary temperature sensor 235 may determine the temperature of the processed fluid vapor flowing out of the inactive scrubber unit and may help to determine the desorption temperature. In some embodiments, the secondary temperature sensor 235 may help to determine when desorption of the scrubber 215 is complete.

FIG. 4 illustrates a flowchart of a method 440 or a series of acts for using a vapor recovery system 210 as discussed herein, according to at least one embodiment of the present disclosure. While FIG. 4 illustrates acts according to one embodiment, alternative embodiments may omit, add to, reorder, and/or modify any of the acts shown in FIG. 4.

In some embodiments, the vapor recovery system may receive a fluid vapor at 441. As discussed herein, the fluid vapor may be at least partially comprised of vaporized working fluid. In some embodiments, the vapor recovery system may condense a first portion of the working fluid from the fluid vapor at 442. After condensing the first portion of the working fluid, the vapor recovery system may direct the condensed first portion of the working fluid to one or more of an immersion tank or a storage tank. In some embodiments, the fluid vapor may contain water vapor, and the vapor recovery system may remove at least some of the water vapor from the fluid vapor with a desiccant.

In some embodiments, the vapor recovery system may adsorb a second portion of the working fluid from the fluid vapor at 443. In some embodiments, the vapor recovery system may determine a composition of the fluid vapor at 444. For example, the vapor recovery system may determine an amount of working fluid present in the fluid vapor. In some embodiments, the vapor recovery system may adjust one or more parameters of one or more components of the fluid recovery system based on the determined composition. For example, the vapor recovery system may adjust a temperature of the condenser and/or adsorber. In another example, the vapor recovery system may adjust a flow rate of the fluid vapor flowing through the system. In some embodiments, the vapor recovery system may direct the fluid vapor back to a condenser based on determining the composition. For example, the vapor recovery system may determine that the processed fluid vapor contains working fluid above an acceptable amount and may direct the processed fluid vapor back to the condenser in order to remove more working fluid from the processed fluid vapor.

In some embodiments, the vapor recovery system may include an active scrubber and an inactive scrubber. For example, the active scrubber may be a scrubber that is configured to actively remove working fluid from the fluid vapor and the inactive scrubber may be a scrubber that is offline or disconnected from the scrubbing process of the vapor recovery system. This may be due to the inactive scrubber being filled, substantially adsorbed, or incapable of effectively removing working fluid from the vapor recovery system as discussed herein. In some embodiments, the vapor recovery system may direct the processed fluid vapor back to the condenser, and along the way, the processed fluid vapor may be used to desorb the inactive scrubber before the processed fluid vapor reaches the condenser.

In some embodiments, the vapor recovery system may exhaust the processed fluid vapor based on determining the composition at 445. For example, the vapor recovery system may exhaust the processed fluid vapor based on determining that the amount of working fluid present in the processed fluid vapor is below a working fluid threshold. In some embodiments, the vapor recovery system may exhaust the processed fluid vapor at no more than 10 ppm of the working fluid.

Figure 5:
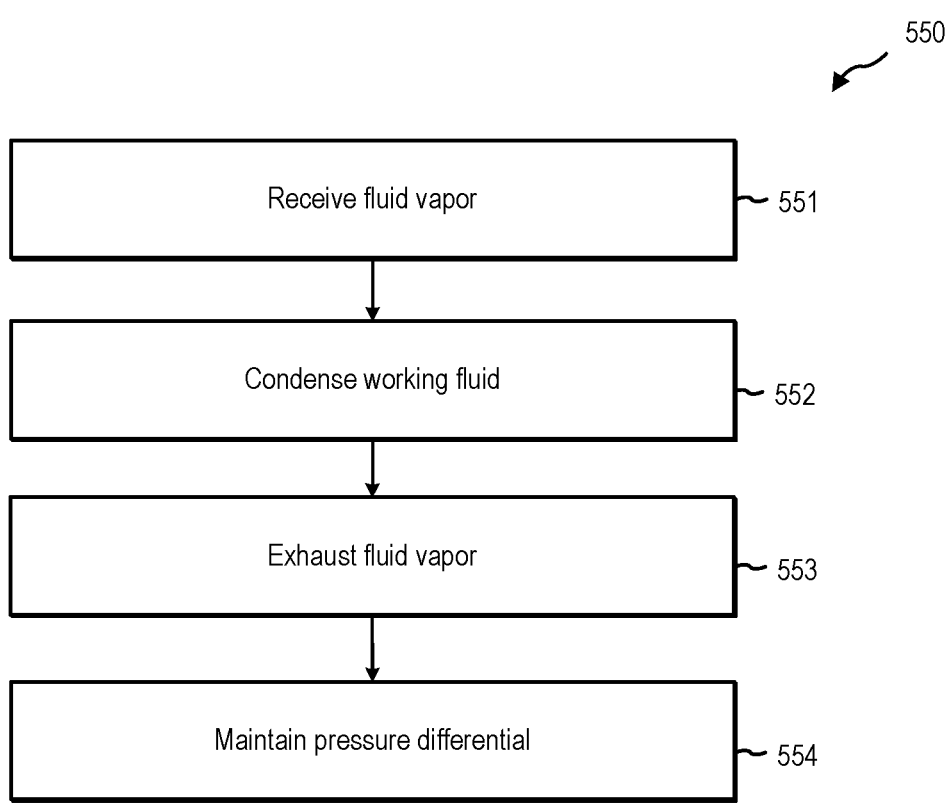
FIG. 5 is a flow diagram of a method of using a vapor recovery system, according to at least one embodiment of the present disclosure.

FIG. 5 illustrates a flowchart of a method 550 or a series of acts for using a vapor recovery system as discussed herein, according to at least one embodiment of the present disclosure. While FIG. 5 illustrates acts according to one embodiment, alternative embodiments may omit, add to, reorder, and/or modify any of the acts shown in FIG. 5.

As discussed herein, the vapor recovery system may define a fluid path flowing from a first end to a second end. The method 550 may include receiving a fluid vapor at the first end at 551. For example, the vapor recovery system may receive the fluid vapor from one or more immersion tanks. In some embodiments, the method 550 may include maintaining a first pressure of the first end of the fluid path below atmospheric pressure. For example, the vapor recovery system may include an inlet at the first end, and the method 550 may include maintaining an inlet pressure of the inlet below atmospheric pressure. In some embodiments, receiving the fluid vapor may maintain a tank pressure of one or more immersion tanks below atmospheric pressure. In some embodiments, the vapor recovery system may exhaust the fluid vapor at the first end if the first pressure reaches a critical pressure. For example, the inlet located at the first end may be connected to an exhaust, and the vapor recovery system may exhaust the fluid vapor from the inlet if the inlet pressure reaches a critical pressure.

As discussed herein, the vapor recovery system may include a condenser located on the fluid path. In some embodiments, the method 550 may include condensing a working fluid from the fluid vapor with the condenser at 552. In some embodiments, the method 550 may include exhausting the processed fluid vapor at the second end of the fluid path at 553. For example, the vapor recovery system may include an exhaust located at the second end of the fluid path. The fluid path may flow from the inlet located at the first end to the exhaust located at the second end, and the vapor recovery system may exhaust the processed fluid vapor at the exhaust.

In some embodiments, the vapor recovery system may maintain a negative pressure differential between the first end of the fluid path and the second end of the fluid path at 554. For example, the vapor recovery system may maintain a negative pressure differential between the inlet located at the first end of the fluid path and the exhaust located at the second end of the fluid path. In some embodiments, the vapor recovery system may include a variable pump located at the second end of the fluid path, and the method 550 may include maintaining the negative pressure differential based on controlling the variable pump. As discussed herein, the vapor recovery system may include a gas expansion system. In some embodiments, the method 550 may include maintaining a constant flow rate along at least a portion of the fluid path with the gas expansion system.

Figure 6:
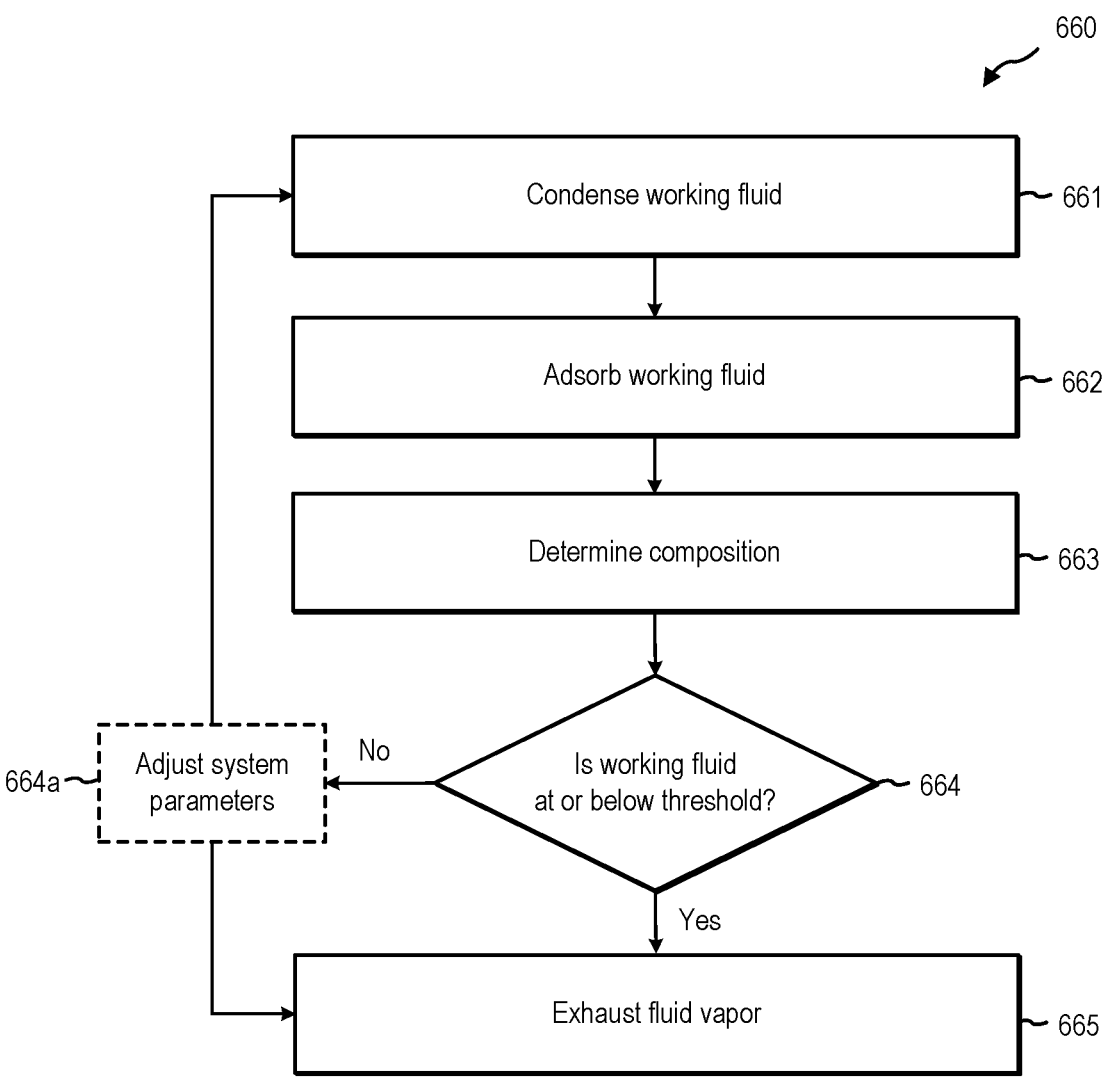
FIG. 6 is a flow diagram of a method of using a vapor recovery system, according to at least one embodiment of the present disclosure.

FIG. 6 illustrates a flowchart of a method 660 or a series of acts for using a vapor recovery system as discussed herein, according to at least one embodiment of the present disclosure. While FIG. 6 illustrates acts according to one embodiment, alternative embodiments may omit, add to, reorder, and/or modify any of the acts shown in FIG. 6.

As discussed herein, the vapor recovery system may receive a fluid vapor, for example through an inlet of the vapor recovery system. The fluid vapor may at least be partially composed of vaporized working fluid. The working fluid may be a dielectric working fluid for use in a two-phase immersion cooling system of a data center. In some embodiments, the working fluid may be expensive, and the vapor recovery system may remove at least a portion of the working fluid from the fluid vapor in order to recover and/or reuse the working fluid. In some embodiments, the vapor recovery system may condense, at least a portion of the working fluid from the fluid vapor at 661. For example, the vapor recovery system may include a condenser to condense the working fluid from the fluid vapor. In some embodiments, the working fluid may be hazardous to health, and the vapor recovery system may remove at least a portion of the working fluid from the fluid vapor in order to exhaust the processed fluid vapor below a working fluid threshold. In some embodiments, the vapor recovery system may adsorb at least a portion of the working fluid from the fluid vapor at 662. For example, the vapor recovery system may include a scrubber to adsorb the working fluid from the fluid vapor.

In some embodiments, the vapor recovery system may determine a composition of the working fluid in the fluid vapor at 663. Based on the composition, the vapor recovery system may determine whether the processed fluid vapor may be exhausted or whether the processed fluid vapor needs to be further processed to remove more working fluid. For example, the vapor recovery system may determine whether the composition has an amount of working fluid that is at or below the working fluid threshold at 664. In some embodiments, the working fluid threshold may be 10 ppm, or any other threshold value, as described herein. If the determined composition does not have an amount of working fluid that is at or below the working fluid threshold, the vapor recovery system may direct the processed fluid vapor back through the various acts of the method 660. For example, the processed fluid vapor may contain more than 10 ppm of the working fluid and the method 660 may loop back to condense more of the working fluid from the processed fluid vapor. In some embodiments, the vapor recovery system may include a condenser and/or a scrubber, and the method 660 may direct the processed fluid vapor back through the condenser and/or the scrubber in order to remove and/or recover more working fluid from the processed fluid vapor. The composition of the processed fluid vapor may then be determined again. In this manner, the fluid vapor may be looped back through the acts of the method 660 one or more times until the amount of working fluid in the fluid vapor is determined to be at or below the working fluid threshold. If the amount of working fluid in the fluid vapor is determined to be at or below the working fluid threshold, the vapor recovery system may exhaust the processed fluid vapor at 665. In this way, the vapor recovery system may loop back through the various acts of the method 660 in order to remove a sufficient amount of the working fluid to exhaust the processed fluid vapor with a composition having an amount of working fluid at or below a working fluid threshold.

In some embodiments, the vapor recovery system may change or adjust one or more system parameters. For example, the vapor recovery system may determine that the composition of the processed fluid vapor is above the working fluid threshold. Accordingly, the vapor recovery system may determine that one or more components of the system needs to be adjusted in order to remove the requisite amount of working fluid vapor from fluid vapor that will yet flow through one or more components of the system. For example, the vapor recovery system may adjust a temperature of the condenser. In another example, the vapor recovery system may adjust a temperature of the scrubber. In yet another example, the vapor recovery system may adjust a flow rate of the fluid vapor through the system. The vapor recovery system may adjust any other parameter of any component of the system, and combinations thereof, in order to fine tune the removal of the working fluid from the fluid vapor as discussed herein As shown in FIG. 6, the series of acts 600 may include an optional act 664a of adjusting the system parameters. This may be in response to a determination that the composition of the processed fluid vapor is above the working fluid threshold. As shown, adjusting the system parameters may be performed in addition to or concurrently with looping back to act 661. For example, the vapor recovery system may determine to pass the fluid vapor back through one or more processes of the system in addition to changing or adjusting one or more parameters of the system. Alternatively or additionally, the vapor recovery system may determine to change or adjust one or more parameters of the system while also exhausting the working fluid at act 665. Further, in one or more embodiments, the vapor recovery system may determine to not perform the optional act 664a, and may determine to proceed with exhausting the working fluid at 665 without looping back to act 661, or without passing the working fluid back through one or more processes of the vapor recovery system. In this way, the vapor recovery system may make determinations and/or adjust parameters of the system based on determining the composition of the processed fluid vapor.

The vapor recovery system as discussed herein has been described with one or more components in specific locations and/or with respect to other components. It should be understood, however, that one or more of the components as discussed herein may be included and/or located in the vapor recovery system at any location suitable for performing the various functions and processes of the vapor recovery system. Additionally, the vapor recovery system as described herein may contain one or more different components, or components in addition to those described herein in order to perform the functions and processes of the vapor recovery system.

Some examples of various terms and phrases that have been used in the above discussion will now be provided.

The term "immersion tank" may refer to any container that is sufficiently large and sturdy to retain a plurality of computing devices that are submerged in dielectric working fluid. An immersion tank that is used in a two-phase immersion cooling system may be capable of being sealed so that vaporized working fluid does not escape from the immersion tank.

The term "fluid" may refer generally to any substance that has the tendency to assume the shape of its container and may include a liquid or a gas.

In some embodiments, two components are in "fluid communication" with one another if there is a path for a fluid to flow between the two components. In other words, a "fluid path" exists between the two structures.

In some embodiments, two components are in "thermal communication" with one another if there is a flow or transfer of heat between the two components.

The term "dielectric working fluid" (or simply "working fluid") may refer to any nonconductive fluid in which computing devices can be submerged for the purpose of cooling the computing devices. Some examples of dielectric working fluids that can be used include synthetic fluids, fluorocarbon-based fluids, mineral oil, and deionized water. A dielectric working fluid may have a relatively low boiling point (e.g., 40-50° C.), such that heat generated by computing devices causes the dielectric working fluid to boil.

The term "fluid vapor" may refer to any fluid that may present in any part of the vapor recovery system. As used herein, fluid vapor may refer to a gaseous fluid present in an immersion tank of an immersion cooling system. The fluid vapor may at least partially be composed of vaporized working fluid, and may also include ambient air, water vapor, or any other particle or substance suspended in a fluid form.

The term "condenser" may refer to any apparatus that may be used to condense vaporized working fluid. In some embodiments, a condenser may include one or more tubes, which may be shaped in the form of one or more coils. Cool liquid may be pumped through the tubes to facilitate condensation of vaporized working fluid. The term "condenser pump" may refer to any machine or device for causing cool liquid to flow through one or more condensers.

The term "scrubber" may refer to any apparatus that may be used to remove airborne vapors suspended in a fluid. In some embodiments, the scrubber may include an adsorbent and/or an adsorbent bed.

The term "adsorbent" or "adsorbent bed" may refer to any natural or synthetic material capable of the sorptive or adsorptive removal of one or more particulates or materials from a fluid. In some embodiments, the physiochemical characteristics may cause the particulates or materials to become deposited on one or more surfaces of the adsorbent.

The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element or feature described in relation to an embodiment herein may be combinable with any element or feature of any other embodiment described herein, where compatible.

The steps, operations, acts, and/or actions of the methods described herein may be interchanged with one another without departing from the scope of the claims. In other words, unless a specific order of steps, operations, and/or actions is required for proper functioning of the method that is being described, the order and/or use of specific steps, operations, and/or actions may be modified without departing from the scope of the claims.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A vapor recovery system, comprising:

an inlet located at a first end of a fluid path configured to receive a fluid vapor to the vapor recovery system;

a condenser located on the fluid path;

a scrubber located on the fluid path;

a composition sensor located on the fluid path between the scrubber and a second end of the fluid path and configured to measure a composition of the fluid vapor that exits the scrubber;

an exhaust located at the second end of the fluid path;

a composition valve located on the fluid path between the scrubber and the exhaust and configured to selectively direct the fluid vapor to the exhaust and to a composition loop that connects back to the fluid path; and a pump positioned at the exhaust and configured to maintain an exhaust pressure at the exhaust less than an inlet pressure at the inlet.

2. The vapor recovery system of claim 1, wherein the composition loop connects back to the condenser to direct the fluid vapor back to the condenser.

3. The vapor recovery system of claim 1, further comprising a desiccant located on the fluid path between the inlet and the condenser.

4. The vapor recovery system of claim 1, wherein the pump is configured to maintain a pressure within the fluid path below atmospheric pressure.

5. The vapor recovery system of claim 1, further comprising a gas expansion system located on the fluid path between the inlet and the condenser.

6. The vapor recovery system of claim 1, further comprising an immersion tank connected to the inlet with one or more of an actuated valve or a pressure release valve.

7. The vapor recovery system of claim 1, further comprising a chiller in thermal communication with the condenser, the scrubber, or the condenser and the scrubber.

8. The vapor recovery system of claim 7, further comprising a heat sink located on the fluid path between the scrubber and the exhaust, the scrubber including an active scrubber and an inactive scrubber, and wherein the chiller is in thermal communication with the inactive scrubber, the heat sink, or the inactive scrubber and the heat sink.

9. A method of operating a vapor recovery system, comprising:

receiving a fluid vapor;

condensing a first portion of a working fluid from the fluid vapor at a condenser;

adsorbing a second portion of the working fluid from the fluid vapor at a scrubber;

determining a composition of a processed fluid vapor after condensing the first portion of the working fluid and after adsorbing the second portion of the working fluid;

if the composition is determined to have an amount of working fluid at or below a working fluid threshold, exhausting the processed fluid vapor; and if the composition is determined to have an amount of working fluid above a working fluid threshold, directing the processed fluid vapor back to the scrubber to desorb the scrubber.

10. The method of claim 9, further comprising after condensing the first portion of the working fluid, directing the first portion of the working fluid to one or more of an immersion tank or a storage tank.

11. The method of claim 9, wherein exhausting the processed fluid vapor includes exhausting the processed fluid vapor at no more than 10 parts per million ("ppm") of the working fluid.

12. The method of claim 9, further comprising after desorbing the scrubber with the processed fluid vapor, directing the processed fluid vapor back to the condenser.

13. The method of claim 12, wherein desorbing the scrubber includes desorbing an inactive scrubber with the processed fluid vapor.

14. The method of claim 9, further comprising removing water from at least a portion of the fluid vapor with a desiccant.

15. The vapor recovery system of claim 2, wherein the composition loop connects back to the condenser by way of the scrubber, to direct the fluid vapor back to the scrubber to desorb the scrubber.

16. The vapor recovery system of claim 1, wherein the composition loop connects back to the scrubber to direct the fluid vapor back to the scrubber to desorb the scrubber.

17. A vapor recovery system, comprising:

an inlet located at a first end of a fluid path configured to receive a fluid vapor to the vapor recovery system, the fluid vapor including vaporized dielectric working fluid;

an adsorptive scrubber located on the fluid path and configured to adsorb at least some of the vaporized dielectric working fluid from the fluid vapor to generate processed fluid vapor;

an exhaust located at a second end of the fluid path; and a valve located on the fluid path between the adsorptive scrubber and the exhaust and configured to selectively direct the processed fluid vapor to the exhaust and to a composition loop that connects back to the adsorptive scrubber to desorb, using the processed fluid vapor, at least some of the dielectric working fluid adsorbed on the adsorptive scrubber.

18. The vapor recovery system of claim 17, further comprising a desiccant located on the fluid path between the inlet and the adsorptive scrubber.

19. The vapor recovery system of claim 17, further compressing a gas expansion system located on the fluid path between the inlet and the adsorptive scrubber.

20. The vapor recovery system of claim 17, further comprising a heat sink located on the fluid path between the adsorptive scrubber and the exhaust.

* * * * *